US008854506B2

(12) United States Patent
Sato et al.

(10) Patent No.: US 8,854,506 B2
(45) Date of Patent: Oct. 7, 2014

(54) SOLID-STATE IMAGING DEVICE, METHOD OF DRIVING THE SAME, AND ELECTRONIC APPARATUS USING THE SAME

(75) Inventors: Mamoru Sato, Kanagawa (JP); Masaki Sakakibara, Kanagawa (JP)

(73) Assignee: Sony Corporation, Tokyo (JP)

( * ) Notice: Subject to any disclaimer, the term of this patent is extended or adjusted under 35 U.S.C. 154(b) by 316 days.

(21) Appl. No.: 13/492,129

(22) Filed: Jun. 8, 2012

(65) Prior Publication Data
US 2013/0016263 A1    Jan. 17, 2013

(30) Foreign Application Priority Data

Jul. 11, 2011    (JP) .................................. 2011-152628

(51) Int. Cl.
*H04N 5/357* (2011.01)
*H04N 5/365* (2011.01)
*H04N 5/361* (2011.01)
*H01L 27/146* (2006.01)
*H04N 5/363* (2011.01)
*H04N 5/378* (2011.01)

(52) U.S. Cl.
CPC ............. *H04N 5/357* (2013.01); *H04N 5/3658* (2013.01); *H04N 5/365* (2013.01); *H04N 5/361* (2013.01); *H01L 27/14612* (2013.01); *H04N 5/363* (2013.01); *H04N 5/378* (2013.01); *H01L 27/14609* (2013.01); *H01L 47/14603* (2013.01)
USPC .......................................... 348/241; 348/302

(58) Field of Classification Search
None
See application file for complete search history.

(56) References Cited

U.S. PATENT DOCUMENTS

2009/0251582 A1* 10/2009 Oike .............................. 348/308
2011/0242378 A1* 10/2011 Mabuchi ....................... 348/296

FOREIGN PATENT DOCUMENTS

JP          2006-108889          4/2006

* cited by examiner

*Primary Examiner* — Roberto Velez
*Assistant Examiner* — Angel L Garces-Rivera
(74) *Attorney, Agent, or Firm* — Rader, Fishman & Grauer PLLC

(57) ABSTRACT

Disclosed herein is a solid-state imaging device including: a photoelectric conversion portion generating signal electric charges corresponding to a quantity of light; a pixel array block having pixels, each of the pixels including three or more electric charge accumulating portions having a first electric charge accumulating portion, a second electric charge accumulating portion, and a third electric charge accumulating portion, and plural pixel transistors; a scanning block carrying out scanning in such a way that accumulation periods of time for the signal electric charges become simultaneous for all of the pixels, and scanning reading-out of the low illuminance signal and the high illuminance signal; and an arithmetic operation processing portion acquiring a false signal accumulated in the third electric charge accumulating portion before the reading-out of the low illuminance signal, and correcting the low illuminance signal and the high illuminance signal by using the false signal.

13 Claims, 26 Drawing Sheets a-a' b-b'

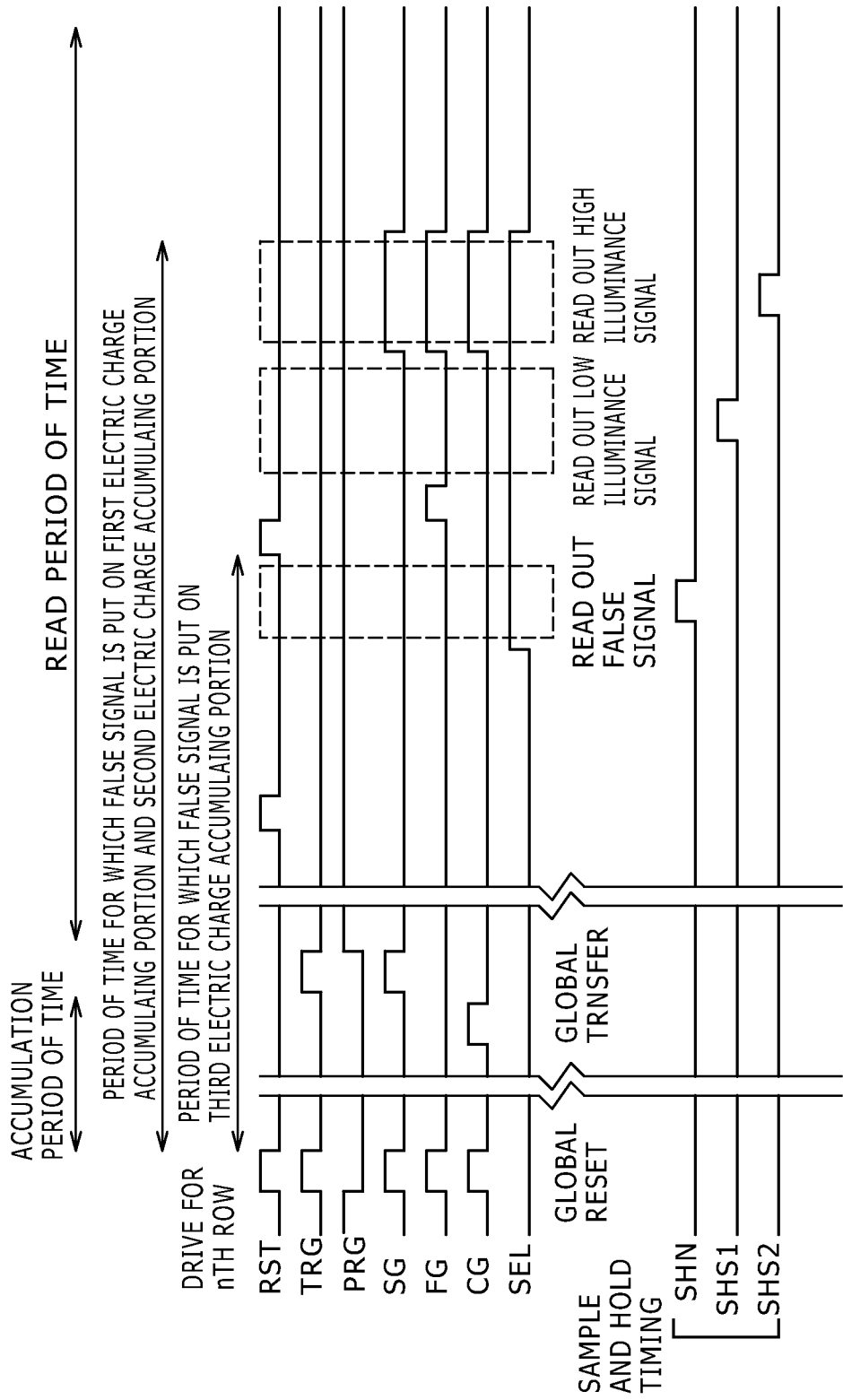

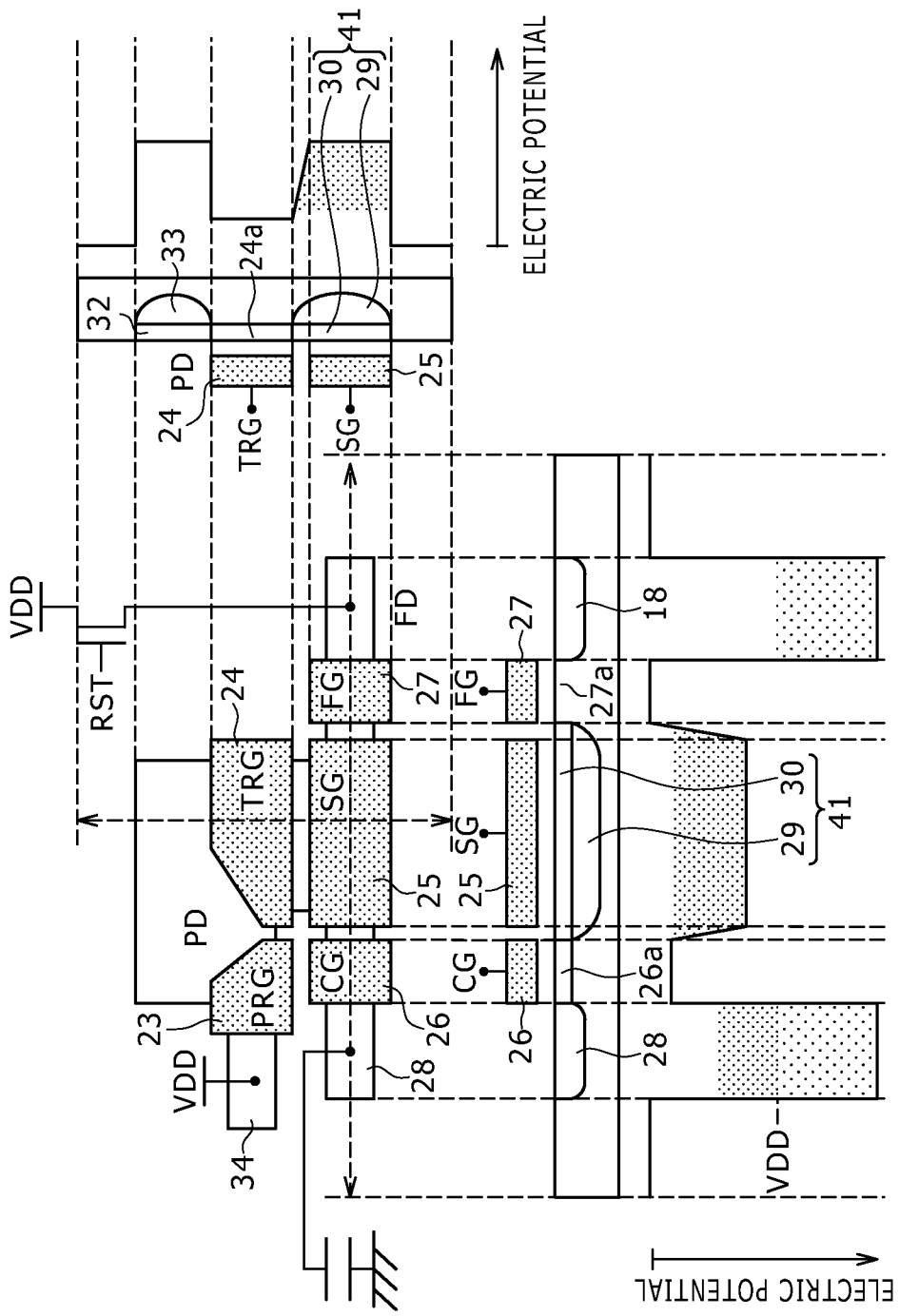

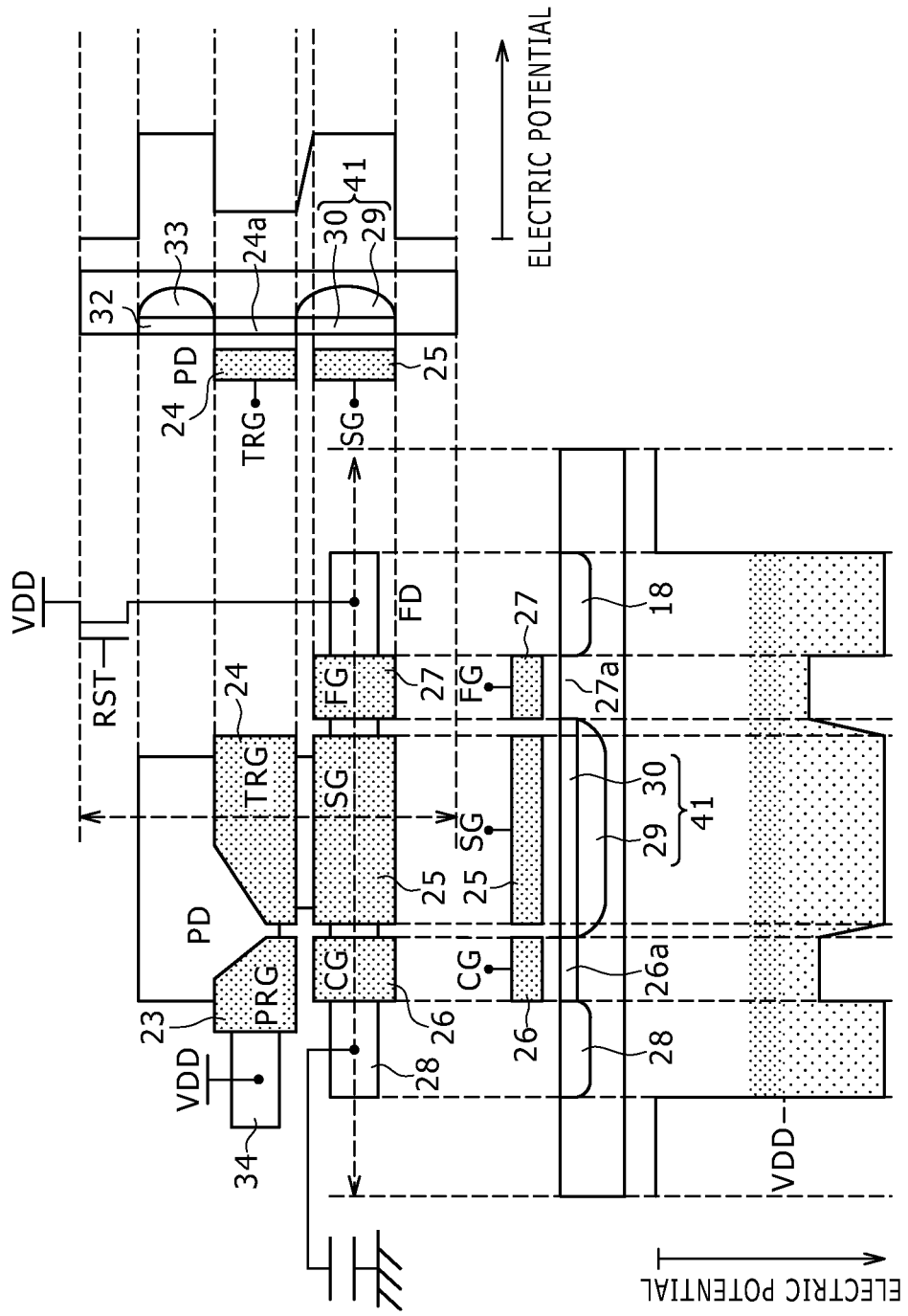

SOLID-STATE IMAGING DEVICE, METHOD OF DRIVING THE SAME, AND ELECTRONIC APPARATUS USING THE SAME

BACKGROUND

The present disclosure relates to a solid-state imaging device, and more particularly to a CMOS (Complementary Metal Oxide Semiconductor) type solid-state imaging device, a method of driving the same, and an electronic apparatus using the same.

A general CMOS type solid-state imaging device has a mechanism for successively scanning two-dimensionally arranged pixel arrays every pixel row, thereby reading out pixel signals from the pixel arrays. A time lag is generated in an accumulation period of time for each pixel row through the row-sequential scanning, thereby causing a phenomenon called a focal plane deformation in which a captured image is deformed in a phase of capturing an image of a moving subject.

In the capturing of an image of a subject, moving at a high speed, for which such an image deformation cannot be allowed, and in a sensing use application requiring simultaneity of the captured image, for the purpose of realizing the simultaneity of the accumulation period of time for the pixel arrays, a global shutter function is proposed. The global shutter function is a function of simultaneously starting the accumulation in the entire surface of the pixel arrays by all-row simultaneously resetting drive for photodiodes in the pixel arrays, and simultaneously ending the accumulation in the entire surface of the pixel arrays by preceding-row simultaneously transferring drive for electric charge accumulating portions such as floating diffusions.

Although the reading-out operation is carried out through the row-sequential scanning in this case as well, in a CMOS type solid-state imaging device having the global shutter function, normally, it is necessary to accumulate signal electric charges until a phase of reading out the signal electric charges in an electric charge accumulating portion such as a floating diffusion. For this reason, there is caused a problem that until the phase of reading out the signal electric charges, the signal electric charges held in the electric charge accumulating portion such as the floating diffusion are deteriorated by noises due to leakage of electric charges and photoelectric conversion in the floating diffusion itself (these noises are referred to as false signals).

On the other hand, a technique disclosed in Japanese Patent Laid-Open No. 2006-108889 proposes a configuration in which a pixel, aimed at correction, generating only a false signal from a floating diffusion without holding signal electric charges accumulated is used separately from a pixel accumulating and holding signal electric charges until a phase of reading out. In this case, the correction is carried out by subtracting a false signal read out from a nearby pixel aimed at the correction from the signal read out from the pixel that carried out accumulating and holding of signal electric charges.

SUMMARY

Now, for obtaining an excellent image having the simultaneity of accumulation periods of time, the trick is how to correct a false signal generated until the phase of the reading-out of signal electric charges in a signal held in the electric charge accumulating portion after end of the accumulation. Japanese Patent Laid-Open No. 2006-108889, as described above, discloses that pixels each aimed at obtaining only a false signal, for example, are alternately disposed either in rows or in columns separately from pixels each carrying out accumulation of signal electric charges, and the false signal obtained therein is subtracted from a read-out signal from a nearby pixel that carried out the accumulation.

The false signal is mainly composed of two components. One of the two components results from a leakage component of electric charges which increase in proportion to time. The other results from the photoelectric conversion in the electric charge accumulating portion itself such as the floating diffusion. In this case, by utilizing that false signals of nearby pixels have a correlation with each other, a pixel for accumulation of electric charges is corrected by using a pixel provided in vicinity and aimed at correction.

However, the pixel obtaining only the false signal without carrying out the accumulation is eventually used only as a correction signal, and thus does not contribute as an image signal. That is to say, when the pixels each aimed at the correction, for example, are alternately disposed either in rows or in columns, the number of effective pixels each carrying out the accumulation is eventually halved. Thus, there may be caused a problem that it is not possible to obtain a resolution comparable with the total number of pixels.

The present disclosure has been made in view of the problem described above, and it is therefore desirable to provide a solid-state imaging device which is capable of reducing the number of false signals without impairing the number of effective pixels in order to obtain an excellent image having simultaneity of accumulation periods of time, and which has a global shutter function in which a pixel area is reduced. It is also desirable to provide a method of driving the solid-state imaging device and an electronic apparatus using the solid-state imaging device.

In order to attain the desires described above, according to an embodiment of the present disclosure, there is provided a solid-state imaging device including:

a photoelectric conversion portion generating signal electric charges corresponding to a quantity of light; a pixel array block having pixels two-dimensionally arranged in a matrix, each of the pixels including three or more electric charge accumulating portions having a first electric charge accumulating portion to which the signal electric charges generated in the photoelectric conversion portion are transferred, a second electric charge accumulating portion to which the signal electric charges, whose amount exceeds a saturated amount of electric charges in the photoelectric conversion portion, of the signal electric charges generated in the photoelectric conversion portion are transferred, and a third electric charge accumulating portion reading out the signal electric charges accumulated in the first electric charge accumulating portion as a low illuminance signal and then reading out the signal electric charges accumulated in the second electric charge accumulating portion together with the signal electric charges accumulated in the first electric charge accumulating portion as a high illuminance signal, and plural pixel transistors transferring and reading out the signal electric charges; a scanning block carrying out scanning in such a way that accumulation periods of time for the signal electric charges become simultaneous for all of the pixels, and scanning reading-out of the low illuminance signal and the high illuminance signal to the third electric charge accumulating portion in a reading-out periods of time every row; and an arithmetic operation processing portion acquiring a false signal accumulated in the third electric charge accumulating portion before the reading-out of the low illuminance signal in a phase of reading out for each row in the reading-out period of time, and correcting both of the low illuminance signal and the high illuminance signal by using the false signal.

In the solid-state imaging device according to the embodiment of the present disclosure, the high illuminance signal is transferred to the second electric charge accumulating portion, and the low illuminance signal is transferred to the first electric charge accumulating portion. In addition, in the phase of the reading-out for each row in the reading-out period of time, the false signal accumulated in the third electric charge accumulating portion is read out before the reading-out of the low illuminance signal. Then, a signal amount of the low illuminance signal and the high illuminance signal is corrected by using the false signal.

According to another embodiment of the present disclosure, there is provided a method of driving the above-described solid-state imaging device, the driving method including: starting exposure simultaneously for all of the pixels, transferring the signal electric charges overflowing from the photoelectric conversion portion to the first electric charge accumulating portion during an exposure period of time to the second electric charge accumulating portion simultaneously for all of the pixels after end of the exposure, and then transferring the signal electric charges accumulated in the photoelectric conversion portion to the second electric charge accumulating portion; acquiring a false signal accumulated in the third electric charge accumulating portion for a reading-out period of time; acquiring the signal electric charges accumulated in the first electric charge accumulating portion as the low illuminance signal; acquiring the signal electric charges accumulated in the second electric charge accumulating portion together with the signal electric charges accumulated in the first electric charge accumulating portion as the high illuminance signal; and subtracting the false signal from both of the low illuminance signal and the high illuminance signal to calculate an amount of signal obtained through the photoelectric conversion in the photoelectric conversion portion during the exposure period of time.

In the method of driving the solid-state imaging device according to another embodiment of the present disclosure, the high illuminance signal is transferred to the second electric charge accumulating portion, and the low illuminance signal is transferred to the first electric charge accumulating portion. In addition, in the phase of the reading-out for each row in the reading-out period of time, the false signal accumulated in the third electric charge accumulating portion is read out before the low illuminance signal is read out. Then, a signal amount of the low illuminance signal and the high illuminance signal is corrected by using the false signal.

According to still another embodiment of the present disclosure, there is provided an electronic apparatus having a solid-state imaging device including: a photoelectric conversion portion generating signal electric charges corresponding to a quantity of light; a pixel array block having pixels two-dimensionally arranged in a matrix, each of the pixels including three or more electric charge accumulating portions including a first electric charge accumulating portion to which the signal electric charges generated in the photoelectric conversion portion are transferred, a second electric charge accumulating portion to which the signal electric charges, whose amount exceeds a saturated amount of electric charges in the photoelectric conversion portion, of the signal electric charges generated in the photoelectric conversion portion are transferred, and a third electric charge accumulating portion reading out the signal electric charges accumulated in the first electric charge accumulating portion as a low illuminance signal and then reading out the signal electric charges accumulated in the second electric charge accumulating portion together with the signal electric charges accumulated in the first electric charge accumulating portion as a high illuminance signal, and plural pixel transistors transferring and reading out the signal electric charges; a scanning block carrying out scanning in such a way that accumulation periods of time for the signal electric charges become simultaneous for all of the pixels, and scanning reading-out of the low illuminance signal and the high illuminance signal to the third electric charge accumulating portion in a reading-out periods of time every row; and an arithmetic operation processing portion acquiring a false signal accumulated in the third electric charge accumulating portion before the reading-out of the low illuminance signal in a phase of reading out for each row in the reading-out period of time, and correcting both of the low illuminance signal and the high illuminance signal by using the false signal.

As set forth hereinabove, according to the embodiments of the present disclosure, the dynamic range is enlarged in the solid-state imaging device having the global shutter function. In addition, the amount of signal is corrected by using the false signal, thereby making it possible to obtain an excellent image. In addition thereto, the electronic apparatus in which the image quality is enhanced can be obtained by using the solid-state imaging device concerned.

BRIEF DESCRIPTION OF THE DRAWINGS

FIG. 7 is a timing chart explaining a method of driving the solid-state imaging device according to the first embodiment of the present disclosure;

FIG. 8G is a cross sectional potential diagram (part 7) showing the movement of the electrons, and the transition of the electric potential from the exposure to the reading-out for the unit pixel, and corresponding to the timing chart shown in FIG. 7;

FIG. 8J is a cross sectional potential diagram (part 10) showing the movement of the electrons, and the transition of the electric potential from the exposure to the reading-out for the unit pixel, and corresponding to the timing chart shown in FIG. 7;

DETAILED DESCRIPTION OF THE PREFERRED EMBODIMENTS

A solid-state imaging device, a method of driving the solid-state imaging device, and an electronic apparatus using the solid-state imaging device according to embodiments of the present disclosure will be described hereinafter with reference to the accompanying drawings. The embodiments of the present disclosure will be described below in accordance with the following order. It should be noted that the present disclosure is not limited to the embodiments which will be described below.

1. First Embodiment: Solid-State Imaging Device
   1-1. Configuration of Solid-State Imaging Device
   1-2. Configuration of Main Portions of Solid-State Imaging Device
   1-3. Method of Driving Solid-State Imaging Device
2. Second Embodiment: Method of Driving Solid-State Imaging Device
3. Third Embodiment: Method of Driving Solid-State Imaging Device
4. Fourth Embodiment: Solid-State Imaging Device
5. Fifth Embodiment: Electronic Apparatus 1. First Embodiment Solid-State Imaging Device

[1-1. Configuration of Solid-State Imaging Device]

Firstly, a solid-state imaging device according to a first embodiment of the present disclosure will be described.

Figure 1:
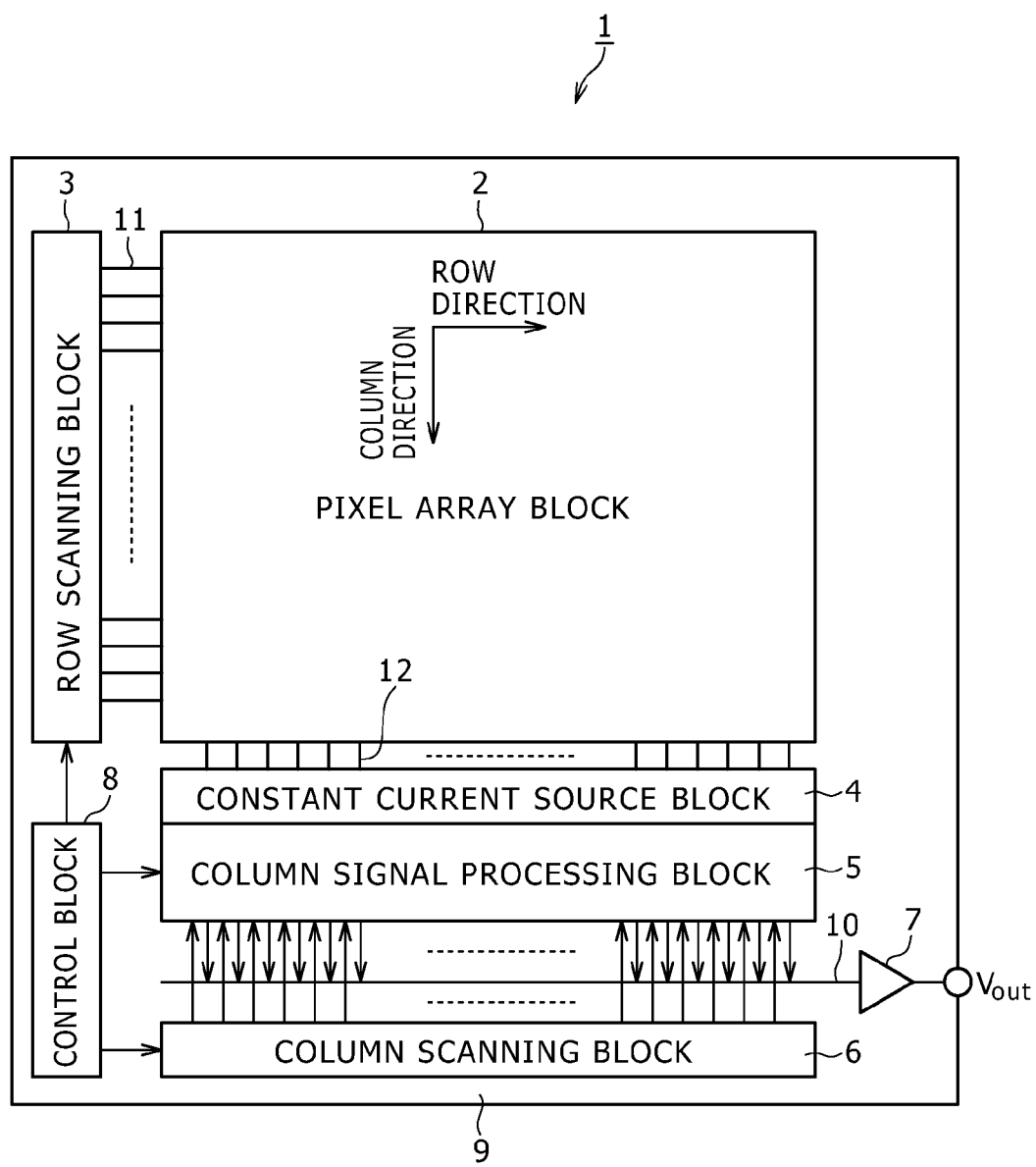
FIG. 1 is a schematic block diagram showing an entire configuration of a CMOS type solid-state imaging device according to a first embodiment of the present disclosure.

FIG. 1 is a schematic block diagram showing an entire configuration of a CMOS type solid-state imaging device according to the first embodiment of the present disclosure.

A solid-state imaging device 1 of the first embodiment includes a pixel array block 2 and peripheral circuit blocks. In this case, the pixel array block 2 is formed on a substrate 9 made of silicon. Also, the peripheral circuit blocks are integrated on the same substrate 9 as with the pixel array block 2. The peripheral circuit blocks, for example, are composed of a row scanning block 3, a constant current source block 4, a column signal processing block 5, a column scanning block 6, an output processing block 7, a control block 8, and the like.

The pixel array block 2 has unit pixels (hereinafter simply referred to as "pixels" in some case) disposed in a row direction and in a column direction, that is, two-dimensionally in a matrix. In this case, each of the unit pixels includes a photoelectric conversion element configured to generate light electric charges (optical signal) whose amount corresponds to a quantity of incident light and accumulate therein the light electric charges thus generated. Here, the row direction means a direction of disposition of the pixels in a pixel row (that is, a horizontal direction). Also, the column direction means a direction of disposition of the pixels in a pixel column (that is, a vertical direction). Details of a concrete circuit configuration of the unit pixel will be described later.

In the pixel array block 2, for the matrix-like pixel disposition, a pixel driving line 11 is wired along the row direction every pixel row, and a vertical signal line 12 is wired along the column direction every pixel column. A drive signal used to carry out driving when a signal is read out from the pixel is transmitted through the pixel driving line 11. Although in FIG. 1, the pixel driving line 11 is shown as one wiring, the number of wirings in the pixel driving line 11 is not limited to one. One end of the pixel driving line 11 is connected to an output terminal, of the row scanning block 3, corresponding to each row.

The row scanning block 3 is composed of a shift register, an address decoder or the like, and drives the pixels of the pixel array block 2 either simultaneously for all of the pixels or in increments of rows. That is to say, the row scanning block 3 composes a driving part configured to drive the pixels of the pixel array block 2 together with the control block 8 controlling the row scanning block 3. Although an illustration of a concrete configuration of the row scanning block 3 is omitted here, in general, the row scanning block 3 includes two scanning systems of a reading-out scanning system and a sweeping-out scanning system.

The reading-out scanning system successively selects and scans the unit pixels of the pixel array block 2 in increments of rows in order to read out signals from the unit pixels. Each of the signals read out from the unit pixels is an analog signal. The sweeping-out scanning system carries out the sweeping-out and scanning for the read rows for which the reading-out and scanning are carried out by the reading-out scanning system in anticipation of the reading-out scanning by a time of a shutter speed.

By the sweeping-out and scanning carried out by the sweeping-out scanning system, unnecessary electric charges are swept out from photoelectric conversion elements of the unit pixels belonging to a read row, thereby resetting the photoelectric conversion elements concerned. Also, by sweeping out (resetting) the unnecessary electric charges by the sweeping-out scanning system, a so-called electronic shutter operation is carried out. Here, the electronic shutter operation means an operation of abandoning light electric charges accumulated in the photoelectric conversion element, and newly starting the exposure (starting the accumulation of light electric charges).

The signal read out through the reading-out operation by the reading-out scanning system corresponds to a quantity of light made incident in and after either the last reading-out operation or the electronic shutter operation. Also, a period of time from either the reading-out timing by the last reading-out operation or the sweeping-out timing by the electronic shutter operation to the reading-out timing by the current reading-out operation becomes a period of time for accumulation of light electric charges in the unit pixel (exposure period of time).

The signals outputted from the unit pixels of the pixel row selected and scanned by the row scanning block 3 are inputted to the constant current source block 4 and the column signal processing block 5 through the respective vertical signal lines 12 every pixel column. The constant current source block 4 has a constant current source 40 (refer to FIG. 2) disposed every pixel column. Bias currents are supplied from constant current sources 40 to the unit pixels through the respective vertical signal lines 12.

The column signal processing block 5 executes predetermined signal processing for the signals outputted from the pixels belonging to the selected row through the vertical signal lines 12 every pixel column of the pixel array block 2. The signal processing executed in the column signal processing block 5 includes, for example, signal processing such as noise removing processing by CDS (correlated double sampling), signal amplifying processing, and AD (analog-to-digital) conversion processing.

However, the signal processing exemplified herein is merely an example, and the signal processing executed in the column signal processing block 5 is not limited thereto. The column signal processing block 5 executes one piece or plural pieces of the various kinds of signal processing. The signal processing in the column signal processing block 5 is one of the features of the first embodiment, and details thereof will be described later.

The column scanning block 6 is composed of a shift register, an address decoder or the like, and selects unit circuits corresponding to the pixel column of the column signal processing block 5 in order. By the selection scanning operation made by the column scanning block 6, the signal subjected to the signal processing every unit circuit in the column signal processing block 5 is supplied to the output processing block 7 in order through a horizontal signal line 10.

The output processing block 7 executes predetermined processing for the signals which have been selected by the column scanning block 6 to be inputted through the horizontal signal line 10 to output the resulting signals to the outside of the substrate 9. The processing executed in the output processing block 7 either can include only buffering in some cases or can include various kinds of signal processing such as adjusting a black level before the buffering, and correcting a dispersion for each pixel column.

The control block 8 includes a timing generator configured to receive a clock signal given thereto from the outside of the substrate 9, a data signal used to instruct an operation mode, and the like, and generate various kinds of timing signals based on these signals. The various kinds of timing signals generated in the control block 8 are supplied to the peripheral circuit blocks such as the row scanning block 3, the column signal processing block 5, and the column scanning block 6, thereby carrying out the drive and control for these peripheral circuit blocks.

[1-2. Configuration of Main Portions of Solid-State Imaging Device]

Figure 2:
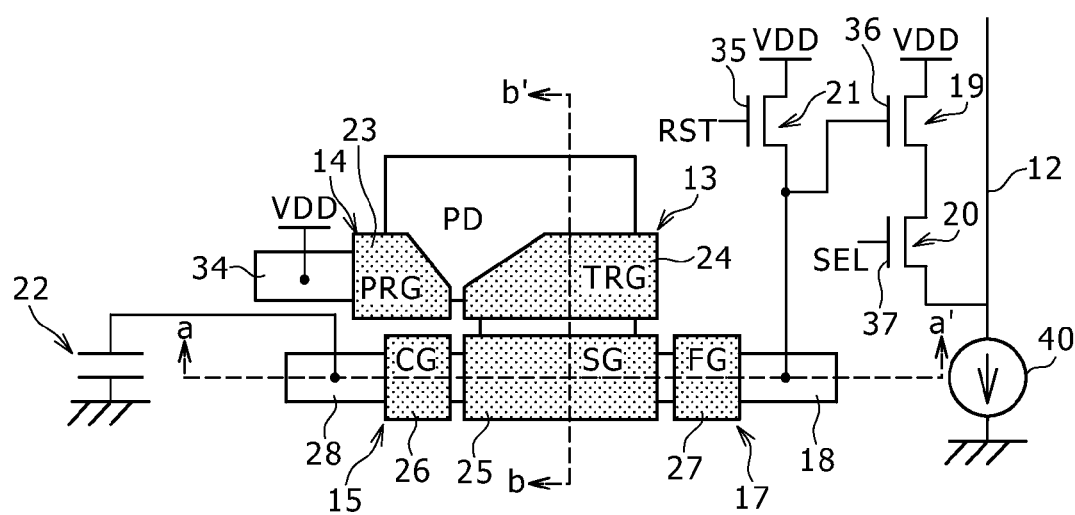
FIG. 2 is a plan view, partly in circuit, showing a configuration of a portion composing a pixel in the solid-state imaging device according to the first embodiment of the present disclosure.
Figure 3A:
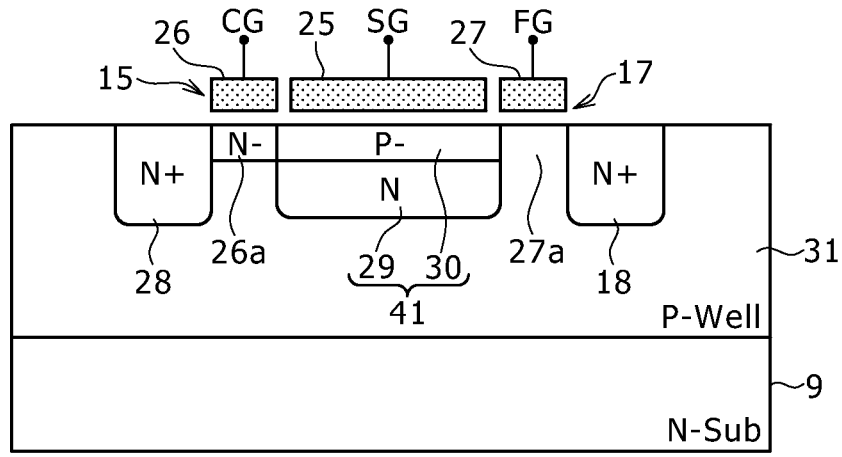
FIGS. 3A and 3B are respectively a cross sectional view taken along a line a-a' of FIG. 2, and a cross sectional view taken along a line b-b' of FIG. 2.
Figure 3B:
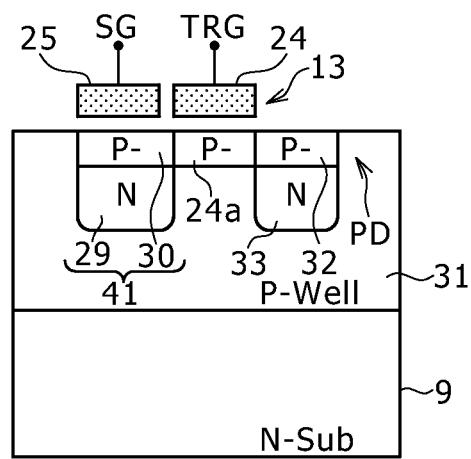
Figure 4:
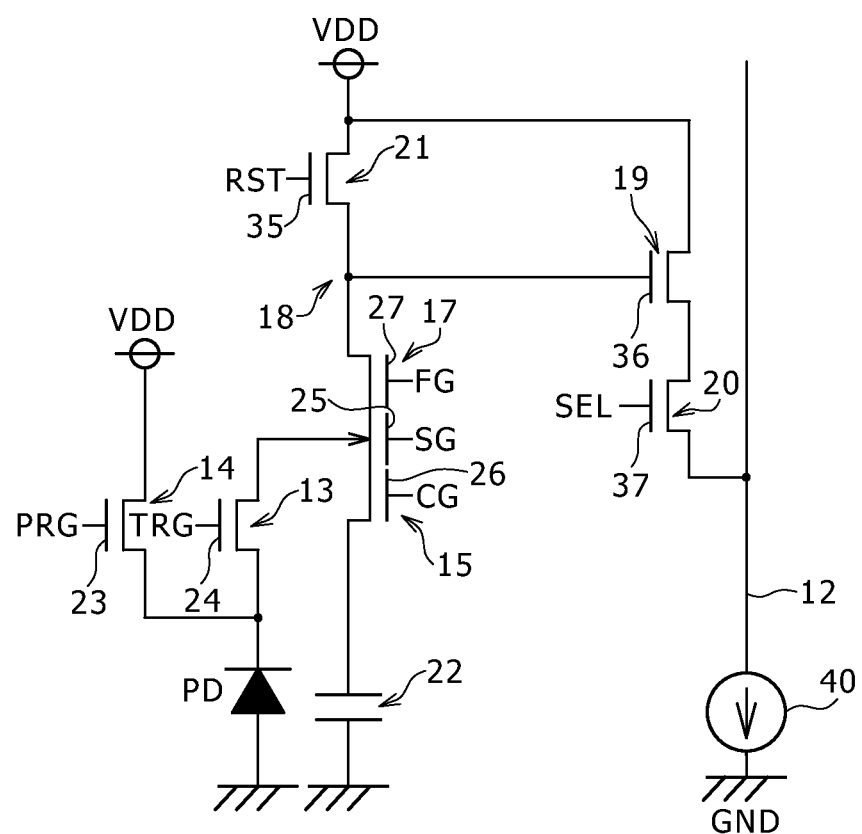
FIG. 4 is a circuit diagram showing a configuration of a unit pixel in the solid-state imaging device according to the first embodiment of the present disclosure.

FIG. 2 is a plan view, partly in circuit, showing a configuration of a portion composing the pixel in the solid-state imaging device 1 according to the first embodiment of the present disclosure. FIG. 3A is a cross sectional view taken along a line a-a' of FIG. 2, and FIG. 3B is a cross sectional view taken along a line b-b' of FIG. 2. FIG. 4 is a circuit diagram showing a configuration of the unit pixel in the solid-state imaging device 1 according to the first embodiment of the present disclosure.

As shown in FIGS. 2 to 4, the solid-state imaging device 1 according to the first embodiment of the present disclosure includes a photoelectric conversion portion (hereinafter referred to as "a photodiode PD") formed on the substrate 9, and first to third electric charge accumulating portions 41, 28, and 18. In addition, the solid-state imaging device 1 further includes first to third transferring transistors 13, 15, and 17, first and second resetting transistors 14 and 21, an amplifier transistor 19, and a selecting transistor 20 which carry out the transfer and reading-out of electric charges.

As shown in FIGS. 3A and 3B, the substrate 9 is composed of a semiconductor substrate of a first conductivity type, for example, an n-type semiconductor substrate. Also, a well region 31 composed of an impurity region of a second conductivity type, for example, a p-type impurity region is formed on a front surface side of the substrate 9 on which the pixels are formed. The photodiode PD, the first to third electric charge accumulating portions 41, 28, and 18, and a source/drain region composing each of the MOS transistors which compose the pixel are all formed within the p-type well region 31.

The photodiode PD composes the photoelectric conversion element. The photodiode PD is composed of a p-type semiconductor region 32 formed on the front surface of the substrate 9, an n-type semiconductor region 33 formed so as to underlie the p-type semiconductor region 32, and the p-type well region 31. In the first embodiment, the main photodiode is composed of pn junctions between the p-type semiconductor region 32 and the n-type semiconductor region 33, and between the p-type well region 31 and the n-type semiconductor region 33.

Signal electric charges corresponding to a quantity of incident light are generated in the photodiode PD, and are accumulated in the n-type semiconductor region 33. In addition, in the first embodiment, in the photodiode PD, the p-type semiconductor region 32 to be a hole accumulating layer is formed on the front surface side. Since a dark current generated in an interface between the substrate 9 and an oxide film (not shown) formed on the front surface side of the substrate 9 is away from an interface between the p-type semiconductor region 32 and the n-type semiconductor region 33, the dark current is suppressed.

The first electric charge accumulating portion 41 is formed in a region adjacent to the photodiode PD through the first transferring transistor 13. Similarly to the case of the photodiode PD, the first electric charge accumulating portion 41 is composed of a p-type semiconductor region 30 formed on the front surface side of the substrate 9, and an n-type semiconductor region 29 formed so as to underlie the p-type semiconductor region 30. In the first electric charge accumulating portion 41, signal electric charges transferred from the photodiode PD by the first transferring transistor 13 are accumulated in the n-type semiconductor region 29 of the first electric charge accumulating portion 41. In addition, in the first electric charge accumulating portion 41 as well, since the p-type semiconductor region 30 is formed on the front surface of the substrate 9, the dark current generated in the interface between the substrate 9 and the oxide film (not shown) formed on the front surface side of the substrate 9 is suppressed.

In addition, an electric potential change electrode 25 is formed, just above the substrate 9 in the region in which the first electric charge accumulating portion 41 is formed, through an insulating film (not shown). A CCD (charge coupled device) structure is structured in such a way that the electric potential change electrode 25 is formed above the first electric charge accumulating portion 41, and a desired electric potential change pulse SG is supplied to the electric potential change electrode 25, thereby changing the electric potential of the first electric charge accumulating portion 41.

The second electric charge accumulating portion 28 is formed in a region adjacent to the first electric charge accumulating portion 41 through the second transferring transistor 15. The second electric charge accumulating portion 28 is composed of a high impurity concentrated n-type semiconductor region formed on the front surface side of the substrate 9. The n-type semiconductor region composing the second electric charge accumulating portion 28 is formed so as to become higher in impurity concentration than each of the n-type semiconductor regions 33 and 29 composing the photodiode PD and the first electric charge accumulating portion 41. The second electric charge accumulating portion 28 composes a capacitor 22 whose one electric potential is set to a fixed electric potential, for example, the grounding electric potential.

The third electric charge accumulating portion 18 is formed in a region adjacent to the first electric charge accumulating portion 41 through the third transferring transistor 17. The third electric charge accumulating portion 18 is composed of an n-type semiconductor region formed on the front surface side of the substrate 9. The third electric charge accumulating portion 18 is composed so as to have an impurity concentration equal to that of, for example, the second electric charge accumulating portion 28, and composes a so-called floating diffusion portion.

The first transferring transistor 13 includes a source composed of the photodiode PD, a drain composed of the first electric charge accumulating portion 41, and a first transfer gate electrode 24 formed on a region of the substrate 9 between the source and the drain through a gate insulating film (not shown). When looking at the circuit diagram shown in FIG. 4, the first transferring transistor 13 is connected to the cathode side of the photodiode PD, and the anode side of the photodiode PD, for example, is connected to a grounding power source.

In the first transferring transistor 13, a first transfer pulse TRG is supplied to the first transfer gate electrode 24, thereby transferring the signal electric charges accumulated in the photodiode PD to the first electric charge accumulating portion 41.

The second transferring transistor 15 includes a source composed of the first electric charge accumulating portion 41, a drain composed of the second electric charge accumulating portion 28, and a second transfer gate electrode 26 formed on the substrate 9 in a region between the source and the drain through a gate insulating film (not shown). It is to be noted that when looking at the circuit diagram shown in FIG. 4, in the second electric charge accumulating portion 28, an electric potential at the side opposite to the second transferring transistor 15 side is set to the grounding electric potential. In addition, a second transfer gate portion 26a formed on the front surface of a region of the substrate 9 between the source and the drain of the second transferring transistor 15 is composed of an n-type semiconductor region having a lower impurity concentration than that of the n-type semiconductor region composing the photodiode PD.

In the second transferring transistor 15, a second transfer pulse CG is supplied to the second transfer gate electrode 26, thereby transferring the signal electric charges accumulated in the first electric charge accumulating portion 41 to the second electric charge accumulating portion 28.

The third transferring transistor 17 includes a source composed of the first electric charge accumulating portion 41, a drain composed of the third electric charge accumulating portion 18, and a third transfer gate electrode 27 formed on the substrate 9 in a region between the source and the drain through a gate insulating film (not shown). A third transfer gate portion 27a formed on the front surface of a region of the substrate 9 between the source and the drain of the third transferring transistor 17 is composed of the well region 31 of the substrate 9.

In the third transferring transistor 17, a third transfer pulse FG is supplied to the third transfer gate electrode 27, thereby transferring the signal electric charges accumulated in the first electric charge accumulating portion 41 to the third electric charge accumulating portion 18.

The first resetting transistor 14 includes a source composed of the photodiode PD, a drain (shown as a drain region 34 in FIG. 2) connected to a power source voltage VDD, and a first reset gate electrode 23 formed between the source and the drain. In the first resetting transistor 14, a first reset pulse PRG is supplied to the first reset gate electrode 23, thereby resetting the electric potential of the photodiode PD to the power source voltage VDD.

The second resetting transistor 21 includes a source composed of the third electric charge accumulating portion 18, a drain connected to the power source voltage VDD, and a second reset gate electrode 35 formed between the source and the drain. In the second resetting transistor 21, a second reset pulse RST is supplied to the second reset gate electrode 35, thereby resetting the electric potential of the third electric charge accumulating portion 18 to a reset voltage by the power source voltage VDD.

The amplifier transistor 19 includes a drain to which the power source voltage VDD is supplied, a source serving as a drain of the selecting transistor 20 as well, and an amplifier gate electrode 36 formed between the source and the drain. In the amplifier transistor 19, the electric potential of the third electric charge accumulating portion 18 is supplied to the amplifier gate electrode 36. As a result, a pixel signal corresponding to the electric potential is outputted to the source.

The selecting transistor 20 includes a drain serving as the source of the amplifier transistor 19 as well, a source connected to the vertical signal line 12, and a selection gate electrode 37 formed between the source and the drain. In the selecting transistor 20, a selection pulse SEL is supplied to the selection gate electrode 37, thereby connecting the selecting transistor 20 to the vertical signal line 12. A source follower circuit is configured with the constant current source 40 connected to one end of the vertical signal line 12, thereby outputting the pixel signal to the vertical signal line 12.

Although in FIG. 2 and FIGS. 3A and 3B, each of the first and second resetting transistors 14 and 21, the amplifier transistor 19, and the selecting transistor 20 is shown in only the plan view or the circuit diagram, and a cross-sectional structure thereof is omitted, each of them is composed of an N-channel MOS transistor similarly to any of other transistors. That is to say, the source/drain region composing each of the first and second resetting transistors 14 and 21, the amplifier transistor 19, and the selecting transistor 20 is composed of an n-type semiconductor region formed on the front surface of the substrate 9, and each gate electrode is formed on the front surface of the substrate 9 through an insulating film.

Figure 5:
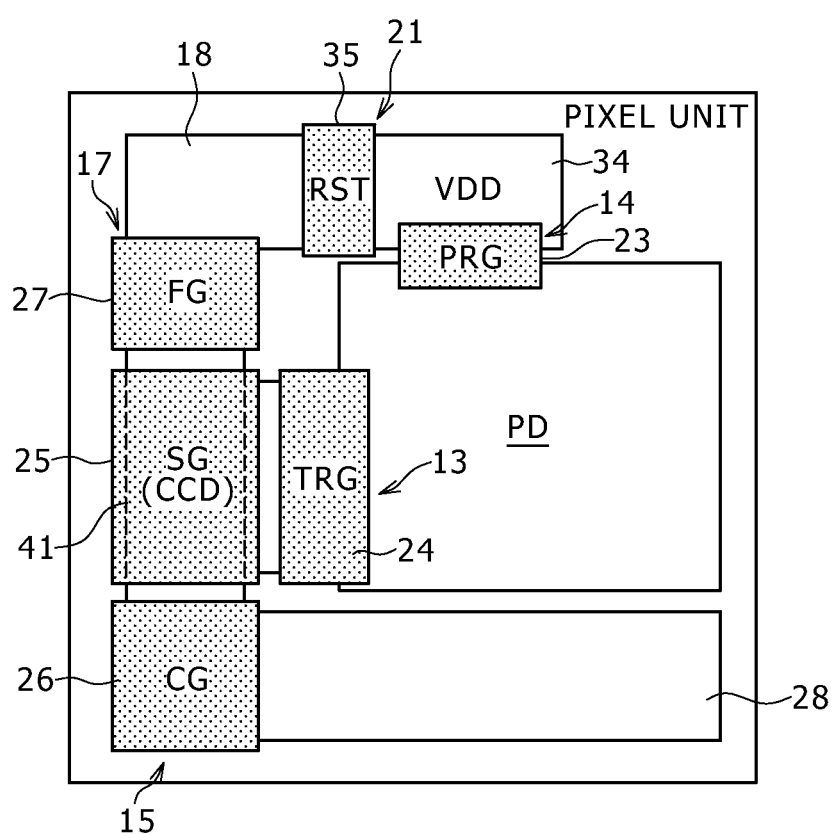
FIG. 5 is a diagram showing an example of a planar layout of a unit pixel.

FIG. 5 is a diagram showing an example of a planar layout of the unit pixel. An illustration of the amplifier transistor 19 and the selecting transistor 20 is omitted in FIG. 5.

As shown in FIG. 5, in the solid-state imaging device 1 of the first embodiment, the first to third electric charge accumulating portions 41, 18, and 28 are formed every pixel so as to surround the photodiode PD, corresponding to which the transistors are formed. In addition, the first resetting transistor 14 and the second resetting transistor 21 hold the drain region 34 in common.

Figure 6:
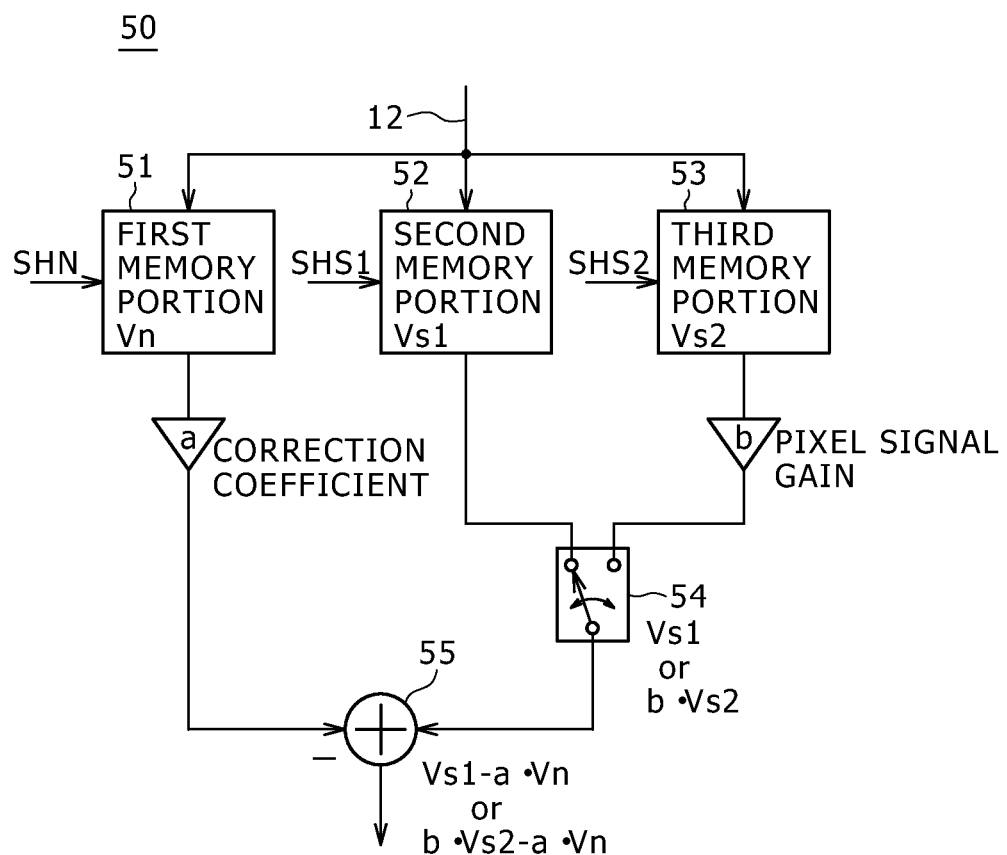
FIG. 6 is a block diagram showing a configuration of an arithmetic operation processing portion used in the solid-state imaging device according to the first embodiment of the present disclosure.

Now, in a subsequent stage of the vertical signal line 12, an arithmetic operation processing portion configured to arithmetically operate a noise signal from the pixel signal is formed in the column signal processing block 5 shown in FIG. 1. FIG. 6 is a block diagram showing a configuration of an arithmetic operation processing portion 50 used in the solid-state imaging device 1 of the first embodiment.

As shown in FIG. 6, the arithmetic operation processing portion 50 includes a first memory unit 51, a second memory unit 52, a third memory unit 53, a selecting unit 54, and an adder 55. In this case, the first memory unit 51 stores therein a noise signal Vn. The second memory unit 52 stores therein a low illuminance signal Vs1. Also, the third memory unit 53 stores therein a high illuminance signal Vs2. The noise signal Vn which has been sent from the vertical signal line 12 is stored in the first memory unit 51 by supplying a sampling pulse SHN set at a high level to the first memory unit 51. Of the pixel signal sent from the vertical signal line 12, the low illuminance signal Vs1 is stored in the second memory unit 52 by supplying a sampling pulse SHS1 set at the high level to the second memory unit 52. In addition, of the pixel signal sent from the vertical signal line 12, the high illuminance signal Vs2 is stored in the third memory unit 53 by supplying a sampling pulse SHS2 set at the high level to the third memory unit 53.

The selecting unit 54 selects a value used to output the pixel signal between the low illuminance signal Vs1 stored in the second memory unit 52, and a value obtained by multiplying the high illuminance signal Vs2 stored in the third memory unit 53 by an image signal addition coefficient b.

The adder 55 adds a value obtained by multiplying a value obtained by multiplying the noise signal Vn stored in the first memory unit 51 by a correction coefficient a, by a minus symbol, and the value selected in the selecting unit 54 to each other. That is to say, the adder 55 subtracts the value of (a·Vn) from the value selected in the selecting unit 54.

[1-3. Method of Driving Solid-State Imaging Device]

Next, a description will be given with respect to a method of driving the solid-state imaging device 1 of the first embodiment. FIG. 7 is a timing chart explaining the method of driving the solid-state imaging device 1 of the first embodiment. FIGS. 8A to 8J are diagrams explaining processes of the driving method, and are cross sectional potential diagrams explaining a movement of electrons and transition of an electric potential from the exposure to the reading-out of the unit pixel, and corresponding to the timing chart shown in FIG. 7. In each of FIGS. 8A to 8J, there are shown a potential diagram corresponding to the cross sectional structure of FIG. 3A, and a potential diagram corresponding to the cross sectional structure of FIG. 3B. In FIGS. 8A to 8J, constituent elements corresponding to those shown in FIGS. 2, 3A and 3B are designated by the same reference symbols.

Figure 8A:
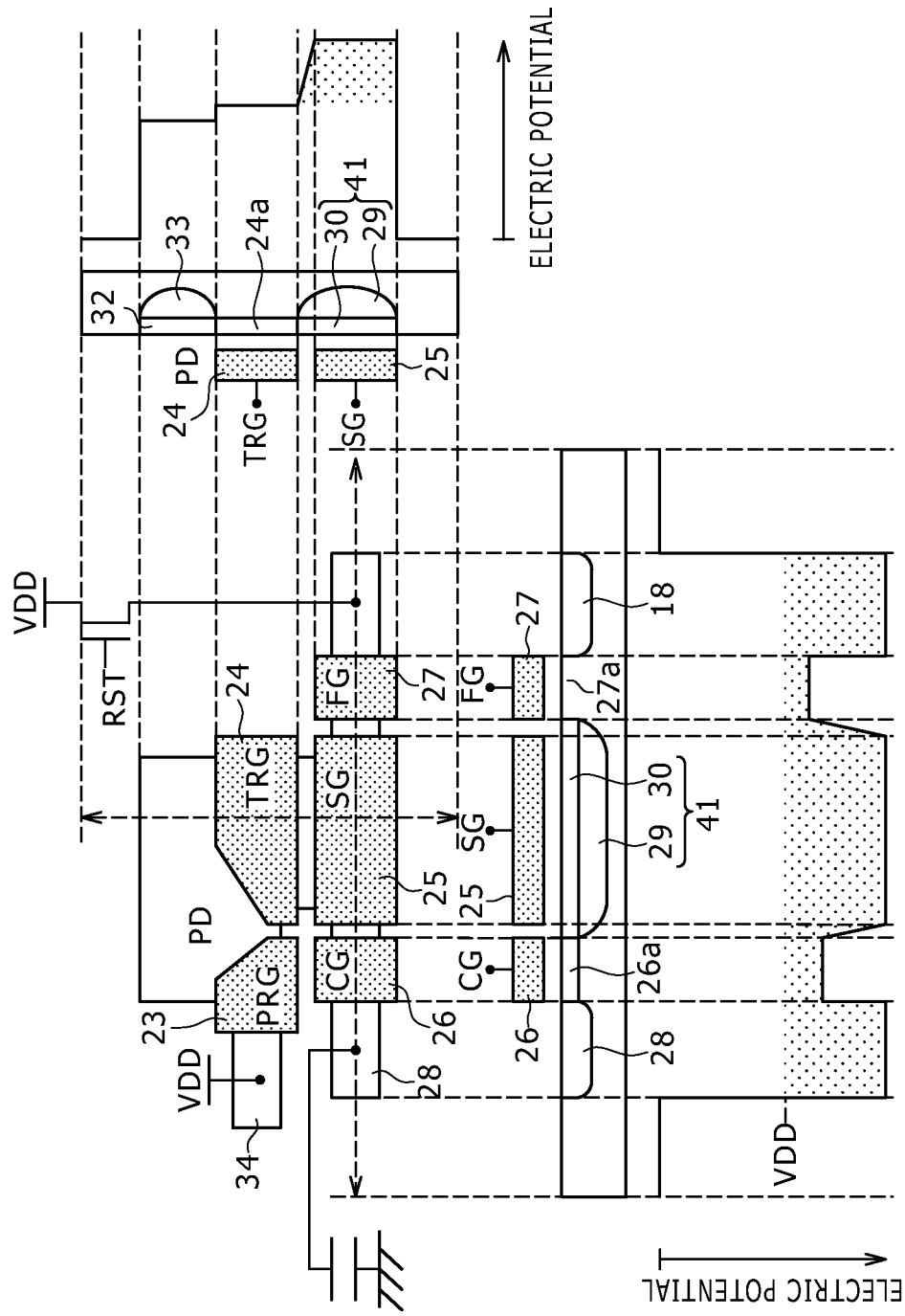
FIG. 8A is a cross sectional potential diagram (part 1) showing a movement of electrons, and transition of an electric potential from exposure to reading-out for a unit pixel, and corresponding to the timing chart shown in FIG. 7.

Firstly, the first reset pulse PRG is set to OFF, and the second reset pulse RST, the first transfer pulse TRG, the second transfer pulse CG, and the third transfer pulse FG are all set to ON simultaneously for all of the pixels. As a result, as shown in FIG. 8A, the electric potentials of the photodiode PD, the first electric charge accumulating portion 41, the second electric charge accumulating portion 28, and the third electric charge accumulating portion 18 are all reset to initial states, simultaneously for all of the pixels, by the power source voltage VDD.

Figure 8B:
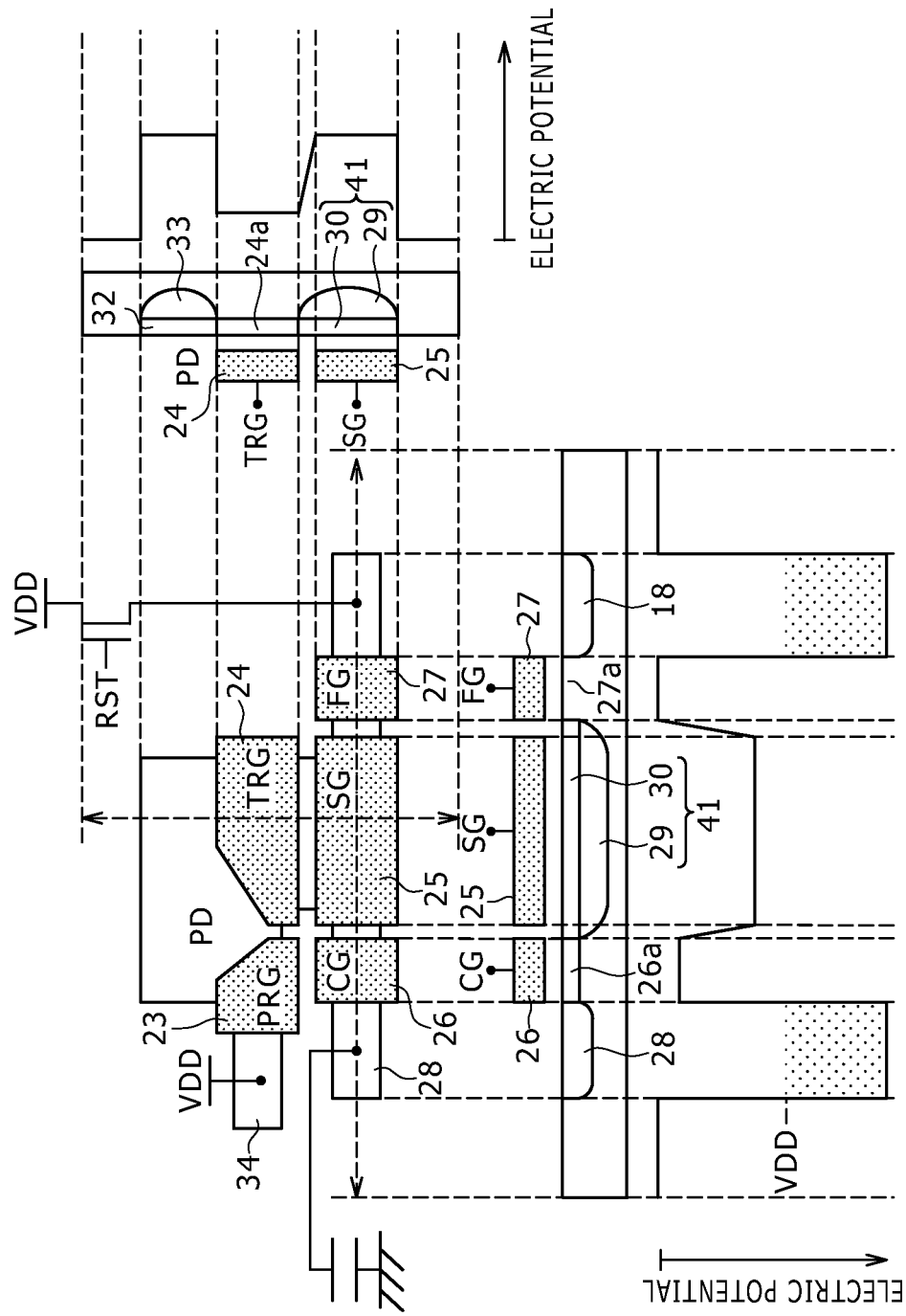
FIG. 8B is a cross sectional potential diagram (part 2) showing the movement of the electrons, and the transition of the electric potential from the exposure to the reading-out for the unit pixel, and corresponding to the timing chart shown in FIG. 7.

Next, the second reset pulse RST, the first transfer pulse TRG, the second transfer pulse CG, and the third transfer pulse FG are all set to OFF. As a result, as shown in FIG. 8B, the signal electric charges in the photodiode PD and the first electric charge accumulating portion 41 are reset. Also, the electric potentials of the second electric charge accumulating portion 28 and the third electric charge accumulating portion 18 are reset to the initial electric potentials.

Figure 8C:
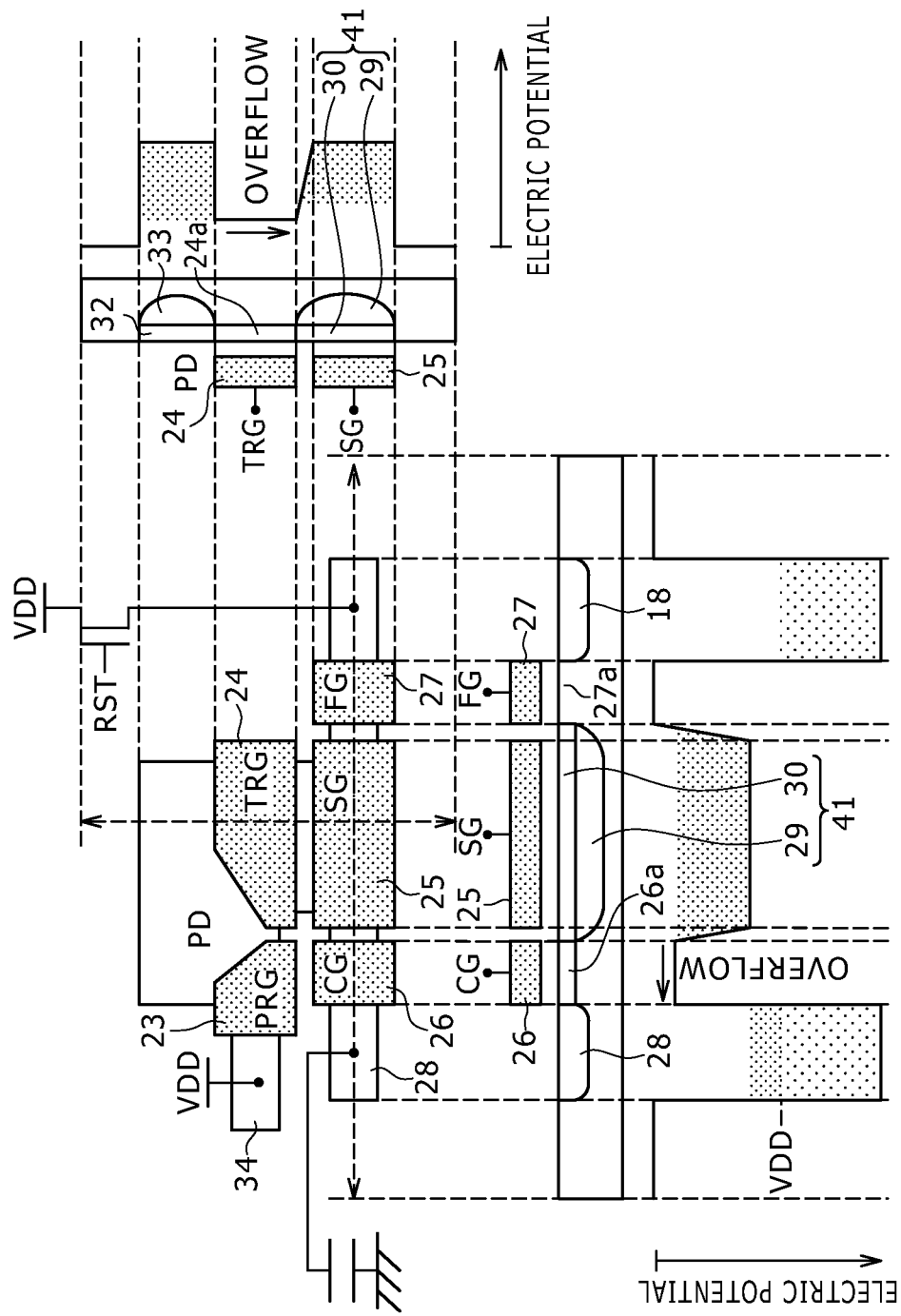
FIG. 8C is a cross sectional potential diagram (part 3) showing the movement of the electrons, and the transition of the electric potential from the exposure to the reading-out for the unit pixel, and corresponding to the timing chart shown in FIG. 7.

Also, concurrently with this operation, the exposure is started simultaneously for all of the pixels. For an exposure period of time, as shown in FIG. 8C, the light made incident to the photodiode PD is subjected to the photoelectric conversion and as a result, the signal electric charges corresponding to a quantity of incident light are generated and accumulated in the photodiode PD. When the light made incident to the photodiode PD has the high illuminance in a phase of accumulation of the signal electric charges, the excessive signal electric charges with respect to a saturated amount of electric charges in the photodiode PD overflow to the first electric charge accumulating portion 41 through a first transfer gate portion 24a. When the signal electric charges which have overflowed to be accumulated in the first electric charge accumulating portion 41 exceed the saturated amount of electric charges of the first electric charge accumulating portion 41, the excessive signal electric charges further overflow to the second electric charge accumulating portion 28 through the second transfer gate portion 26a. At this time, the electric potential of the second transfer gate portion 26a composed of the n-type semiconductor region is deeper than that of the third transfer gate portion 27a composed of the p-type well region 31. For this reason, the signal electric charges which have overflowed from the first electric charge accumulating portion 41 do not overflow to the third electric charge accumulating portion 18, but overflow to the second electric charge accumulating portion 28.

Figure 8D:
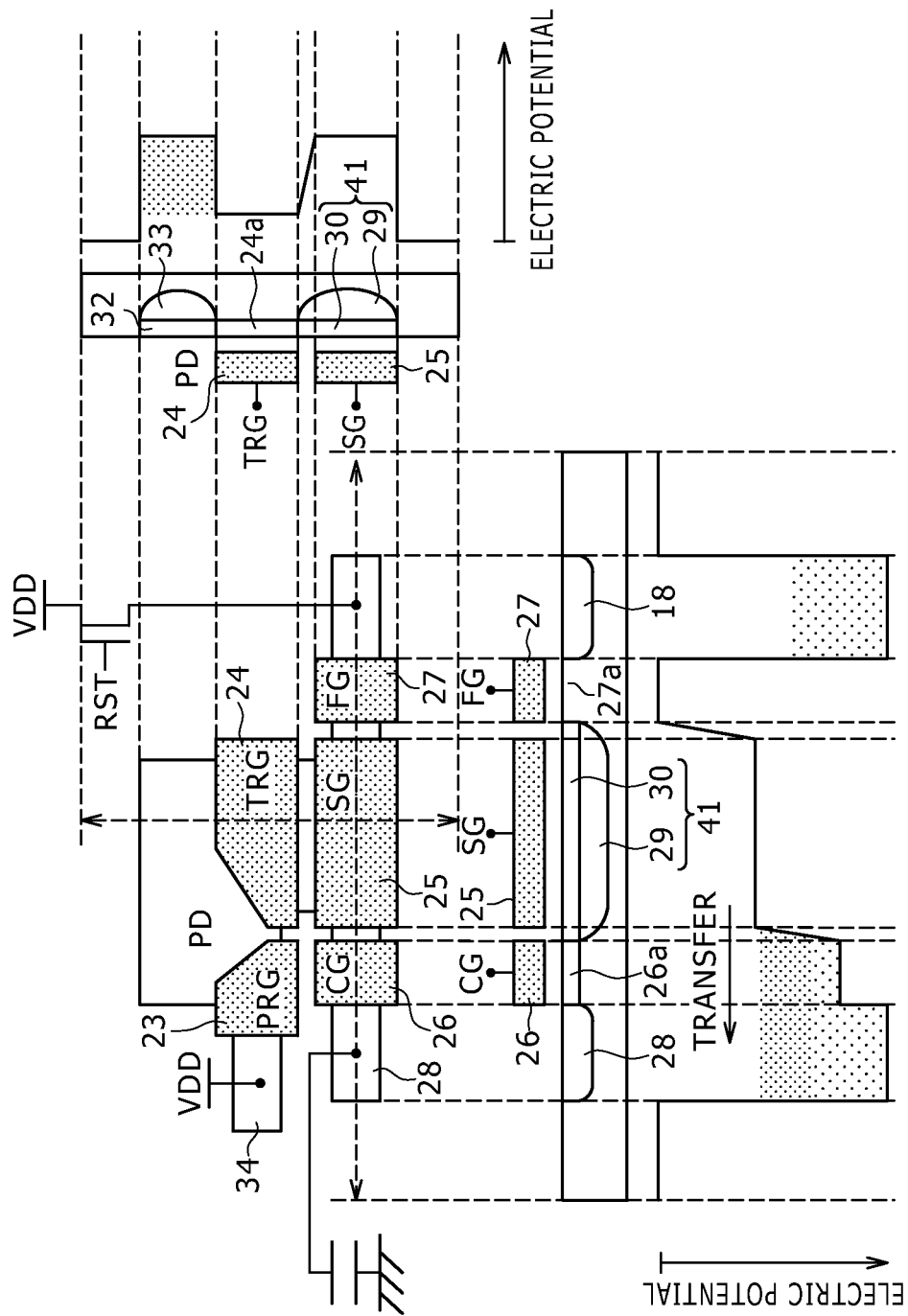
FIG. 8D is a cross sectional potential diagram (part 4) showing the movement of the electrons, and the transition of the electric potential from the exposure to the reading-out for the unit pixel, and corresponding to the timing chart shown in FIG. 7.
Figure 8E:
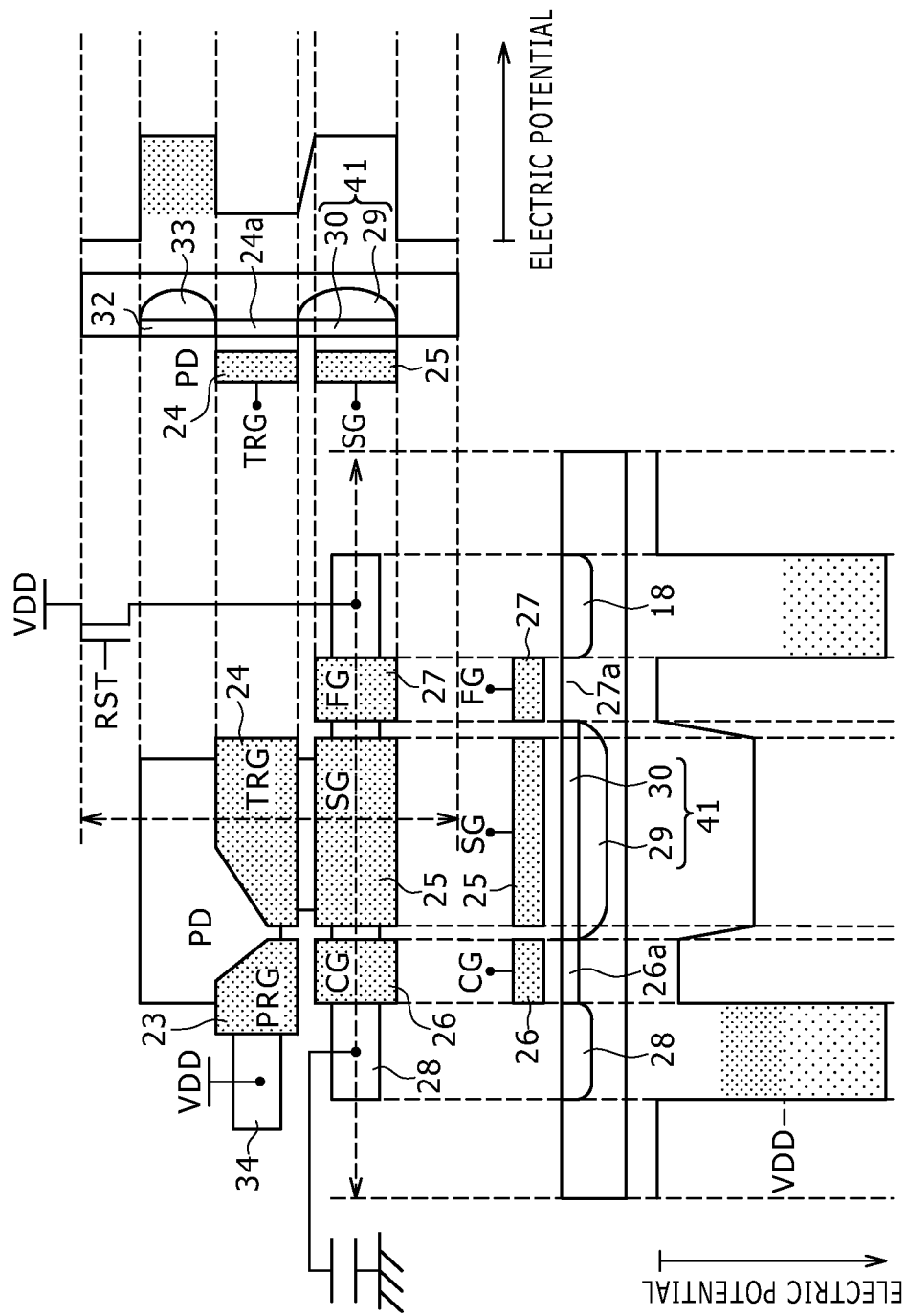
FIG. 8E is a cross sectional potential diagram (part 5) showing the movement of the electrons, and the transition of the electric potential from the exposure to the reading-out for the unit pixel, and corresponding to the timing chart shown in FIG. 7.

Next, the second transfer pulse CG is set to ON simultaneously for all of the pixels. As a result, as shown in FIG. 8D, the signal electric charges accumulated in the first electric charge accumulating portion 41 are transferred to the second electric charge accumulating portion 28. Also, by setting the second transfer pulse CG to OFF, as shown in FIG. 8E, the transfer of the signal electric charges from the first electric charge accumulating portion 41 to the second electric charge accumulating portion 28 is ended.

Figure 8F:
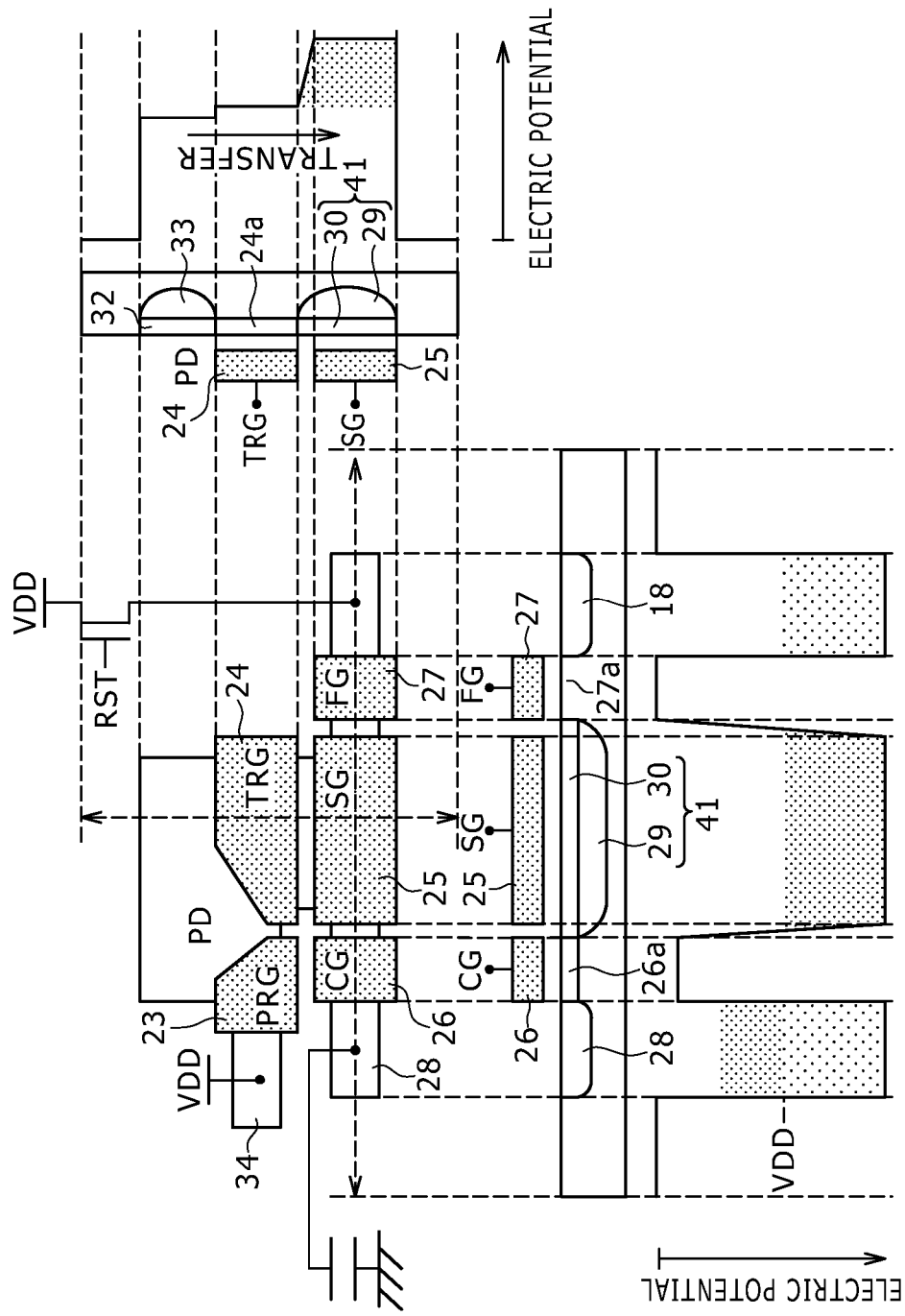
FIG. 8F is a cross sectional potential diagram (part 6) showing the movement of the electrons, and the transition of the electric potential from the exposure to the reading-out for the unit pixel, and corresponding to the timing chart shown in FIG. 7.

Next, the first transfer pulse TRG and the electric potential change pulse SG are both set to ON simultaneously for all of the pixels. As a result, as shown in FIG. 8F, the signal electric charges accumulated in the photodiode PD are transferred to the first electric charge accumulating portion 41 through the first transfer gate portion 24a. After that, the first transfer pulse TRG and the electric potential change pulse SG are both set to OFF, and the first reset pulse PRG is set to ON, whereby as shown in FIG. 8G, the electric potential of the photodiode PD is reset by the power source voltage VDD and as a result, the exposure period of time is ended.

The drive which has been carried out for the exposure period of time so far is made simultaneously for all of the pixels and is so-called global exposure.

Next, a description will be given with respect to the reading-out for each row. After the global exposure has been ended, the pixels are scanned in order from the pixels belonging to the first row, thereby carrying out a rolling reading-out. In this case, however, the description will be given by exemplifying the nth row.

After end of the reading-out of the pixels belonging to the (n−1)th row, firstly, the selection pulse SEL for the pixels belonging to the nth row is set to ON, and a false signal (noise signal) Vn accumulated in the third electric charge accumulating portion 18 is read out. Also, in the arithmetic operation processing portion 50 shown in FIG. 6, the sampling pulse SHN is inputted to the first memory unit 51, thereby storing the false signal Vn in the first memory unit 51. After that, the second reset pulse RST is set to ON, and the false signal Vn accumulated in the third electric charge accumulating portion 18 is reset.

Figure 8H:
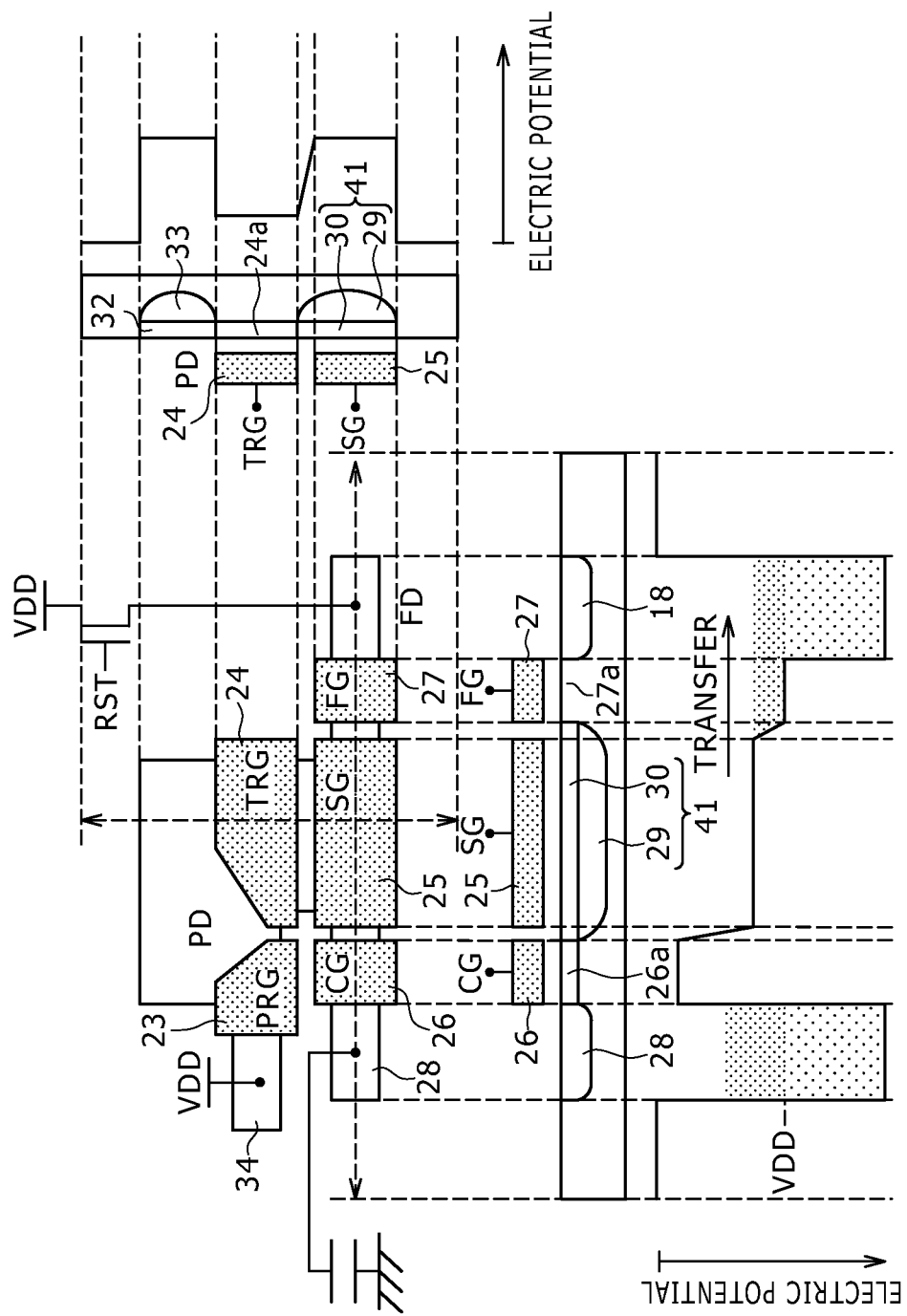
FIG. 8H is a cross sectional potential diagram (part 8) showing the movement of the electrons, and the transition of the electric potential from the exposure to the reading-out for the unit pixel, and corresponding to the timing chart shown in FIG. 7.
Figure 8I:
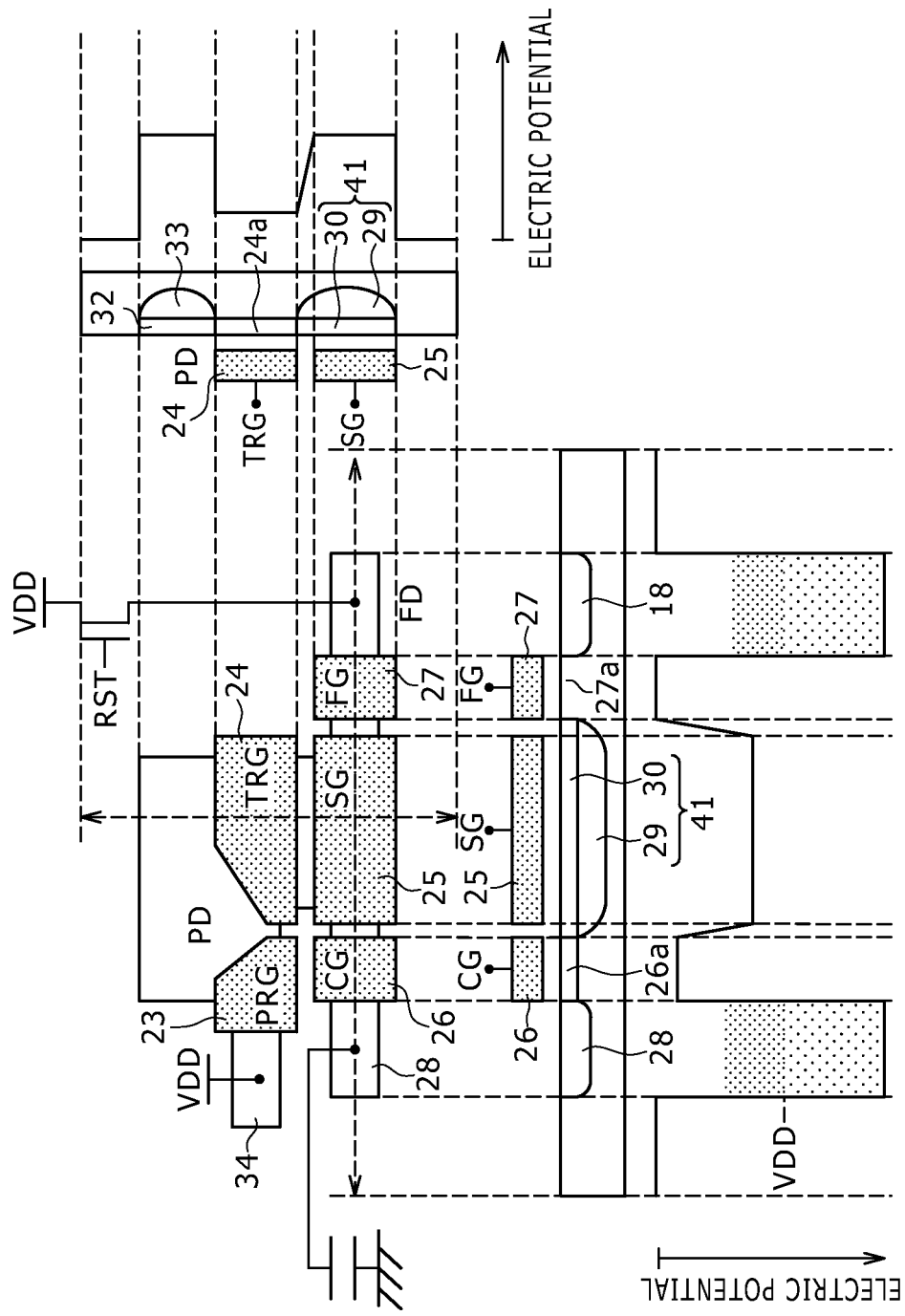
FIG. 8I is a cross sectional potential diagram (part 9) showing the movement of the electrons, and the transition of the electric potential from the exposure to the reading-out for the unit pixel, and corresponding to the timing chart shown in FIG. 7.

Next, in the pixels belonging to the nth row, the third transfer pulse FG is set to ON, and as shown in FIG. 8H, the signal electric charges accumulated in the first electric charge accumulating portion 41 are transferred to the third electric charge accumulating portion 18. After that, the third transfer pulse FG is set to OFF. As a result, as shown in FIG. 8I, the transfer of the signal electric charges accumulated in the first electric charge accumulating portion 41 to the third electric charge accumulating portion 18 is ended. After the signal electric charges transferred to the third electric charge accumulating portion 18 have been amplified in the amplifier transistor 19, the resulting signal electric charges are read out to the vertical signal line 12 through the selecting transistor 20. Since the signal electric charges accumulated in the first electric charge accumulating portion 41 in the phase of end of the exposure are the signal electric charges which did not overflow from the photodiode PD, the signal electric charges concerned are read out as the low illuminance signal Vs1 to the vertical signal line 12.

Now, the low illuminance signal Vs1 thus outputted has a value obtained by superposing a false signal (V_1 false signal) generated in the first electric charge accumulating portion 41 and a reset level signal (V_rst1) for the third electric charge accumulating portion 18 on a signal (V_1 accumulated signal) accumulated in the first electric charge accumulating portion 41. That is to say, the low illuminance signal Vs1 is expressed by Vs1=V_1 accumulated signal+V_1 false signal+V_rst1. Thus, in the low illuminance signal Vs1, the signal electric charges (false signal) generated in the first electric charge accumulating portion 41 and a fixed pattern noise (reset level signal) are added to the signal electric charges accumulated in the photodiode PD.

When the low illuminance signal Vs1 is outputted, as shown in FIG. 6, in the arithmetic operation processing portion 50, the sampling pulse SHS1 is inputted to the second memory unit 52, whereby the low illuminance signal Vs2 read out to the vertical signal line 12 is stored in the second memory unit 52.

Next, in the pixels belonging to the nth row, the electric potential change pulse SG, the third transfer pulse FG, and the second transfer pulse CG are all set to ON, and as shown in FIG. 8J, the first electric charge accumulating portion 41, the second electric charge accumulating portion 28, and the third electric charge accumulating portion 18 are coupled to one another through the capacitive coupling. As a result, the signal electric charges accumulated in the second electric charge accumulating portion 28 are read out. The signal electric charges read out at this time are the signal electric charges accumulated when the light made incident to the photodiode PD has the high illuminance, that is, the signal electric charges which overflowed from the photodiode PD to the first and second electric charge accumulating portions 41 and 28. For this reason, the signal electric charges thus read out are read out as the high illuminance signal Vs2 to the vertical signal line 12 through the amplifier transistor 19 and the selecting transistor 20.

Now, the high illuminance signal Vs2 thus read out has a value obtained by superposing the false signals (V_(1+2) false signals) generated in the first and second electric charge accumulating portions 41 and 28, and the reset level signal (V_rst2) for the third electric charge accumulating portion 18 on the signals (V_(1+2) accumulated signals) accumulated in the first and second electric charge accumulating portions 41 and 28. That is to say, the high illuminance signal Vs2 concerned is expressed by Vs2=(V_(1+2) accumulated signals+ (V_(1+2) false signals+V_rst2. Thus, in the high illuminance signal Vs2, the signal electric charges (false signals) generated in the first and second electric charge accumulating portions 41 and 28 and the fixed pattern noise (reset level signal) are added to the signal electric charges accumulated in the photodiode PD.

Also, when the high illuminance signal Vs2 is outputted, as shown in FIG. 6, in the arithmetic operation processing portion 50, the sampling pulse SHS2 is inputted to the third memory unit 53, whereby the high illuminance signal Vs2 read out to the vertical signal line 12 is stored in the third memory unit 53.

After that, the electric potential change pulse SG, the second transfer pulse CG, the third transfer pulse FG, and the selection pulse SEL are all set to OFF, thereby ending the reading-out operation for the pixels belonging to the nth row.

The signals (Vn, Vs1, and Vs2), from the pixels belonging to the nth row, which have been obtained in the manner as described above are processed in the arithmetic operation processing portion 50. By scanning the pixels belonging to the nth row, the first memory unit 51 stores therein the false signal Vn. The second memory unit 52 stores therein the low illuminance signal Vs1 (=V_1 accumulated signal+V_1 false signal+V_rst1). The third memory unit 53 stores therein the high illuminance signal Vs2 (=(V_(1+2) accumulated signals+(V_(1+2) false signals+V_rst2).

Now, in the solid-state imaging device 1 of the first embodiment, the reading-out timings for the first to third electric charge accumulating portions 41, 28, and 18 are close to one another. For this reason, a leakage component of the false signal Vn generated in the third electric charge accumulating portion 18 for a period of time from the collective transfer to the reading-out has a correlation with the false signals generated in the first and second electric charge accumulating portions 41 and 28. In addition, components of a false signal resulting from that the photoelectric conversion is generated in the first to third electric charge accumulating portions 41, 28, and 18 themselves when illuminated with light have a strong correlation as the places where the photoelectric conversion is carried out are closer in distance to one another. In the solid-state imaging device 1 of the first embodiment, the strong correlation is obtained because the first to third electric charge accumulating portions 41, 28, and 18 are disposed on the same pixel.

Figure 9A:
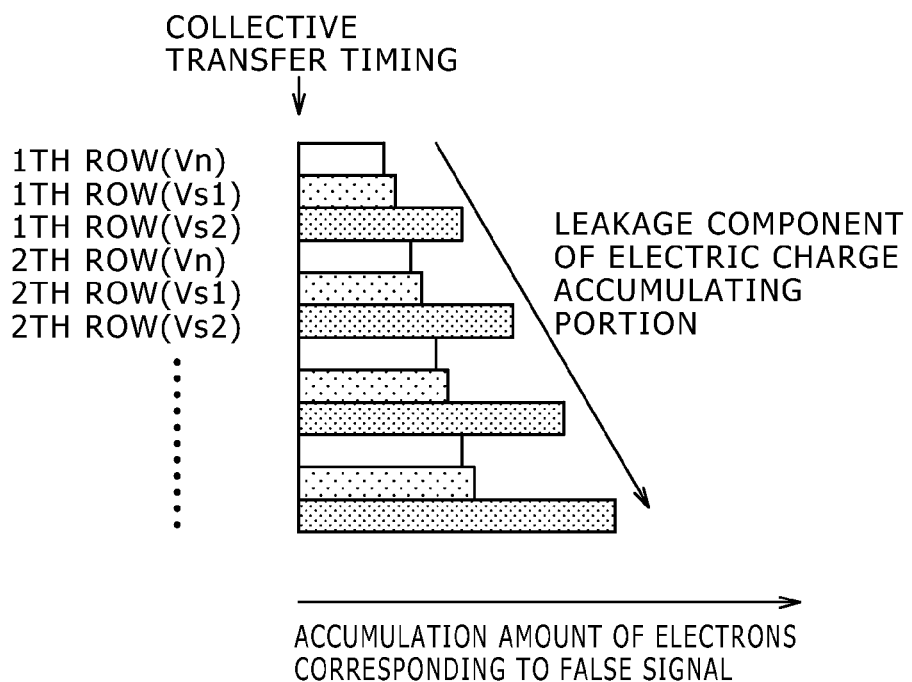
FIGS. 9A and 9B are respectively diagrams showing an accumulation amount of false signals generated in pixels belonging to individual rows until pixel signals are read out from the pixels belonging to the individual rows after transfer is ended simultaneously for all of the pixels.
Figure 9B:
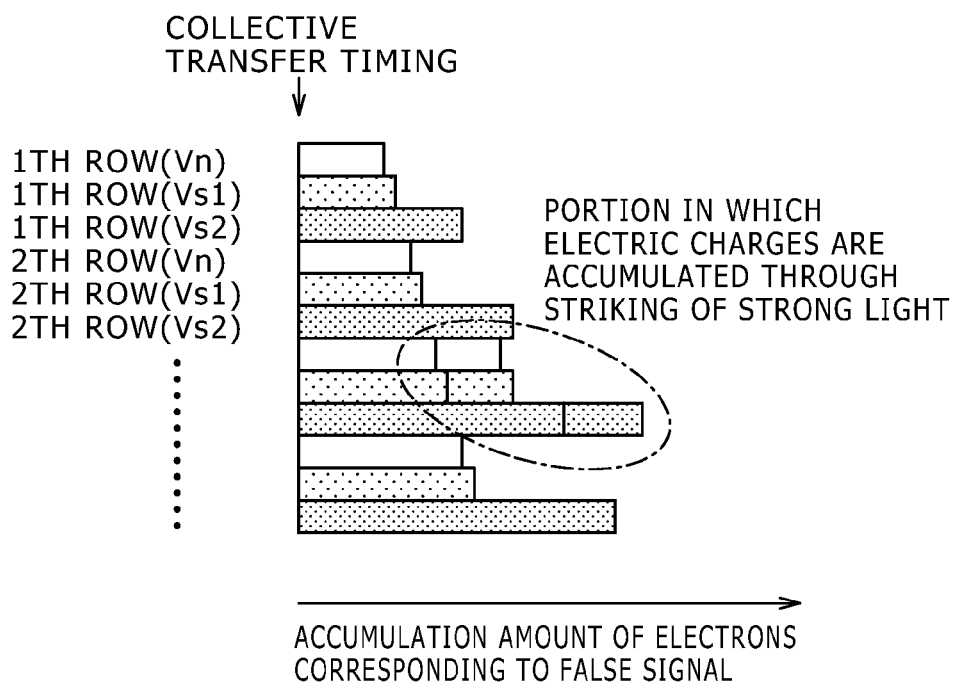

FIGS. 9A and 9B show an accumulation amount of false signals which are generated in the pixels of the rows until the pixels are read out from the individual rows after the transfer has been completed simultaneously for all of the pixels. As shown in FIG. 9A, as the reading-out proceeds from the pixels belonging to the first row to the later pixels, the number of the false signals accumulated in the third electric charge accumulating portion 18 increases, and the signal amounts of the low illuminance signal Vs1 and the high illuminance signal Vs2 also increase. That is to say, it is shown that the false signals Vn accumulated in the third electric charge accumulating portion 18 have the storing correlation with the false signals which the low illuminance signal Vs1 and the high illuminance signal Vs2 contain therein.

Also, as shown in FIG. 9B, when a strong light is radiated to a certain pixel, the number of the false signals Vn accumulated in the third electric charge accumulating portion 18 increases, and the numbers of the low illuminance signal Vs1 and the high illuminance signal Vs2 in the pixel also increase in the same way. Therefore, it can be said that the pixels are corrected by using the false signals Vn generated in the third electric charge accumulating portion 18 and obtained in those pixels, whereby a more precise correction can be carried out every pixel.

Since the first to third electric charge accumulating portions 41, 28, and 18 have the strong correlation in such a way, it is assumed that the false signal accumulated either in the first electric charge accumulating portion 41 or in the second electric charge accumulating portion 28 is identical to the false signal Vn accumulated in the third electric charge accumulating portion 18. In that case, the desired accumulated signal obtained by removing away any of the noises has a value obtained by subtracting the false signal Vn from either the low illuminance signal Vs1 or the high illuminance signal Vs2. Actually, however, the conditions of the false signals generated in the first to third electric charge accumulating portions 41, 28, and 18, and the fixed noise pattern differ depending on the characteristics such as the areas, the impurity concentrations, and the capacitances of the first to third electric charge accumulating portions 41, 28, and 18. Therefore, it is realistic that the arithmetic operation processing portion 50 is given the function of carrying out the multiplication using the addition coefficient b and the correction coefficient a shown in FIG. 6, thereby executing the arithmetic operation processing.

Hereinafter, a description will be given with respect to the arithmetic operation processing to which the addition coefficient b and the correction coefficient a are applied.

At the end of provision of the false signal Vn, the low illuminance signal Vs1, and the high illuminance signal Vs2, the arithmetic operation processing portion 50 executes the processing for subtracting the false signal Vn from either the low illuminance signal Vs1 or the high illuminance signal Vs2 by using the addition coefficient b and the correction coefficient a.

Figure 10:
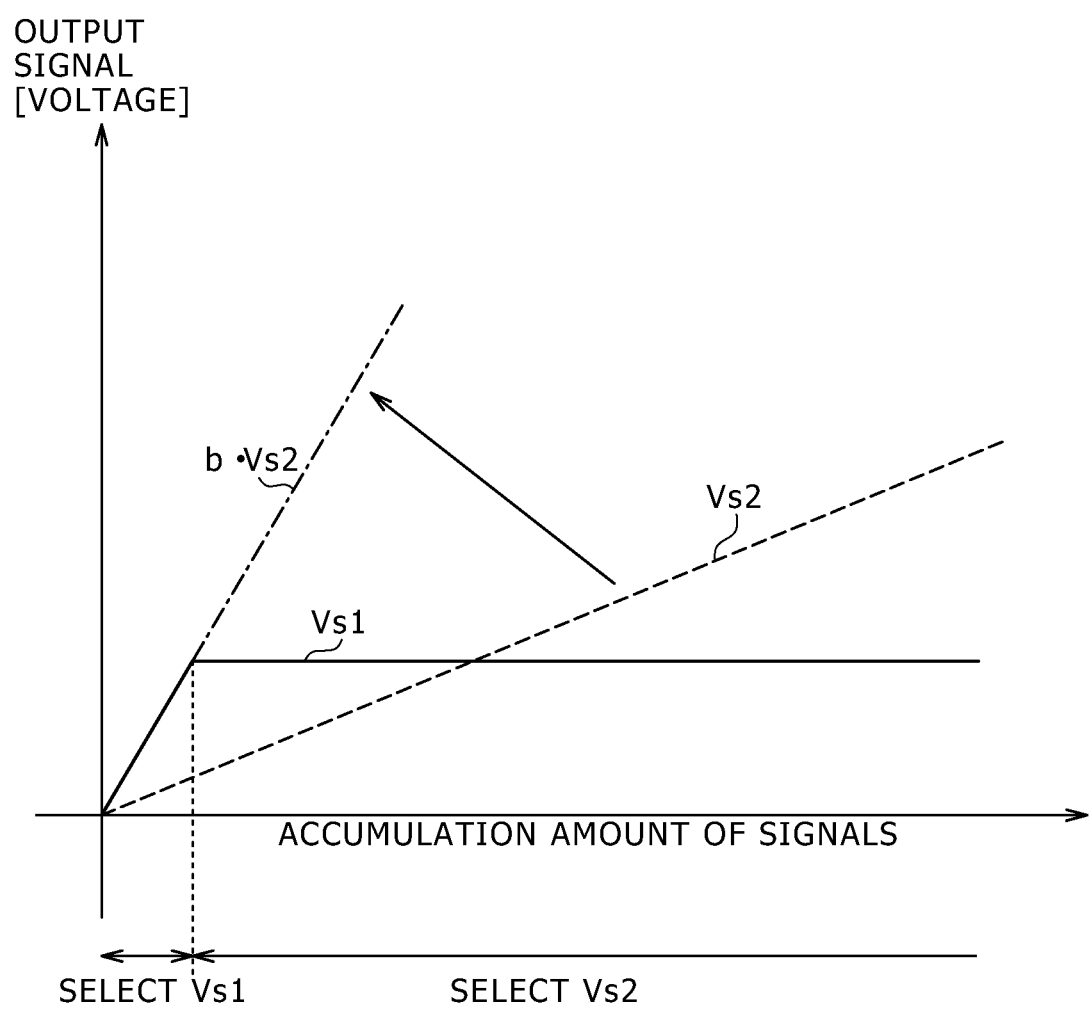
FIG. 10 is a graphical representation showing a relationship between an accumulation amount of signals, and output signals of a low illuminance signal and a high illuminance signal.

FIG. 10 is a graphical representation showing a relationship between the accumulation amount of signals, and the output signals of the low illuminance signal Vs1 and the high illuminance signal Vs2. In the first embodiment, whether the low illuminance signal Vs1 is selected or the high illuminance signal Vs2 is selected in the selecting unit 54 is determined depending on the difference in the accumulation amount of signals (output signals). When the first electric charge accumulating portion 41 is not saturated, the low illuminance signal Vs1 is selected in the selecting unit 54, and is then used in the arithmetic operation for the pixel signals. The noise is less in the low illuminance signal Vs1 than in the high illuminance signal Vs2. For this reason, when the accumulation amount of signals is small, that is, when the low illuminance signal Vs1 does not reach the saturated amount of electric charges in the first electric charge accumulating portion 41, the low illuminance signal Vs1 is selected, thereby making it possible to obtain the pixel signal containing therein the less noise.

When the first electric charge accumulating portion 41 is saturated, a value (b·Vs2) obtained by multiplying the high illuminance signal Vs2 by the addition coefficient b is selected in the selecting unit 54, and is then used in the arithmetic operation for the pixel signals. Although the noise is more in the high illuminance signal Vs2 than in the low illuminance signal Vs1, the noise does not affect so much when the accumulation amount of signals is large.

Here, the addition coefficient b is a coefficient obtained in consideration of the characteristics of the first to third electric charge accumulating portions 41, 28, and 18. Thus, as shown in FIG. 10, the addition coefficient b is a value which is set in such a way that in the high illuminance signal Vs2, a gradient of the output signal obtained for the accumulation amount of signals is made to correspond to the low illuminance signal Vs1.

Also, in the first embodiment, a value comparable to the signal amount of the signal electric charges generated in the photodiode PD during the exposure period of time can be found out by subtracting a value of (a·Vn) from the value selected in the selecting unit 54. In addition, in the first embodiment, the precise correction can be carried out because the signal electric charges in the individual rows are corrected by using the strongly-correlated false signals Vn generated in the third electric charge accumulating portion 18 formed in the same pixel. It is to be noted that the correction coefficient a is a value obtained in consideration of the area ratio, the impurity concentrations, and the capacitance values of the first to third electric charge accumulating portions 41, 28, and 18.

As described above, in the first embodiment, the false signal Vn generated in the third electric charge accumulating portion 18 and having the strong correlation with the false signals generated in the first electric charge accumulating portion 41 and the second electric charge accumulating portion 28 is read out for a period of time from the global transfer to the reading-out for the rows. The subtraction for the false signals can be carried out by subtracting the value obtained by multiplying the false signal Vn thus read out by the correction coefficient a from the signal electric charges read out.

In addition, in the first embodiment, the first to third electric charge accumulating portions 41, 28, and 18 are configured, so that both of the low illuminance signal Vs1 and the high illuminance signal Vs2 are obtained, thereby making it possible to obtain an image having an excellent dynamic range.

In such a way, in the first embodiment, in the solid-state imaging device 1 having the global shutter function in which the dynamic range is enlarged, the false signal Vn is read out for a period of time from the global transfer to the reading-out for the rows, and the pixel signal is corrected by using the false signal Vn thus read out. As a result, since the false signal correction can be carried out without disposing another pixel for acquisition of the false signal, the effective pixels are prevented from being impaired.

It is to be noted that although in the first embodiment, the description has been given by exemplifying the solid-state imaging device having the three electric charge accumulating portions, a configuration of having three or more electric charge accumulating portions may also be adopted for the solid-state imaging device. In this case as well, similarly to the case of the first embodiment, one electric charge accumulating portion not accumulating therein any of the signal electric charges is provided, and the false signal is corrected by using the one electric charge accumulating portion, thereby making it possible to reduce the number of false signals in the solid-state imaging device having the global shutter function.

Now, in the first embodiment, in the selecting unit 54, as shown in FIG. 10, the low illuminance signal Vs1 is switched over to the high illuminance signal Vs2 at a certain point of the accumulated signal level. However, when the switching time point is determined at a certain signal level in the selecting unit 54, the switching noise at the certain signal level becomes conspicuous. Therefore, preferably, a configuration is adopted such that a rate between the low illuminance signal Vs1 and the high illuminance signal Vs2 is gradually changed. Hereinafter, a solid-state imaging device including an arithmetic operation processing portion configured to gradually change the rate between the low illuminance signal Vs1 and the high illuminance signal Vs2 will be described as a modification example of the first embodiment.

Figure 11:
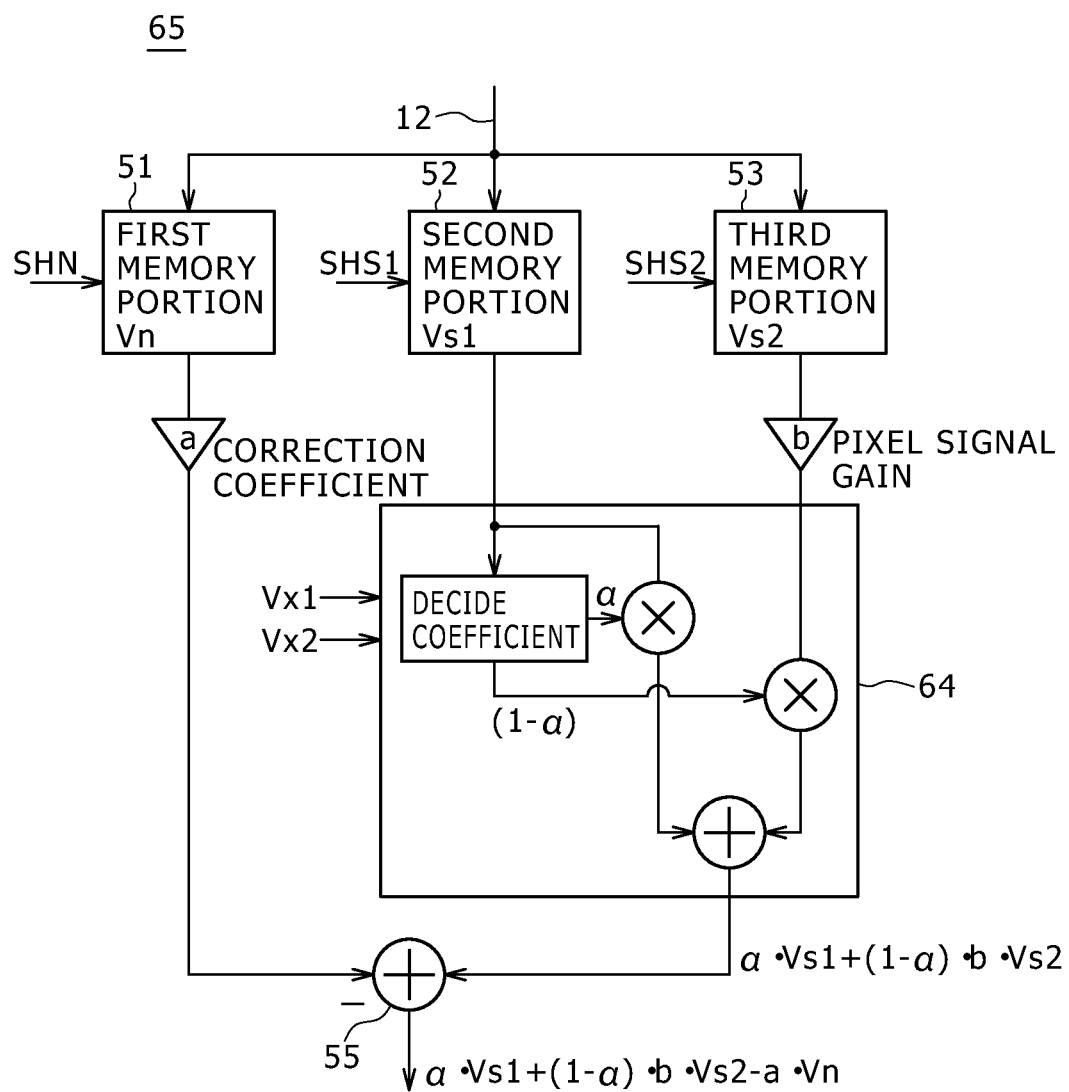
FIG. 11 is a block diagram showing a configuration of an arithmetic operation processing portion in a solid-state imaging device according to a modification example.

FIG. 11 is a block diagram showing a configuration of the arithmetic operation processing portion used in the solid-state imaging device according to the modification example of the first embodiment. In FIG. 11, constituent elements corresponding to those shown in FIG. 6 are designated by the same reference symbols, and a repeated description is omitted here. An arithmetic operation processing portion 65 shown in FIG. 11 is different in configuration of a selecting unit 64 from the arithmetic operation processing portion 50 shown in FIG. 6.

Figure 12:
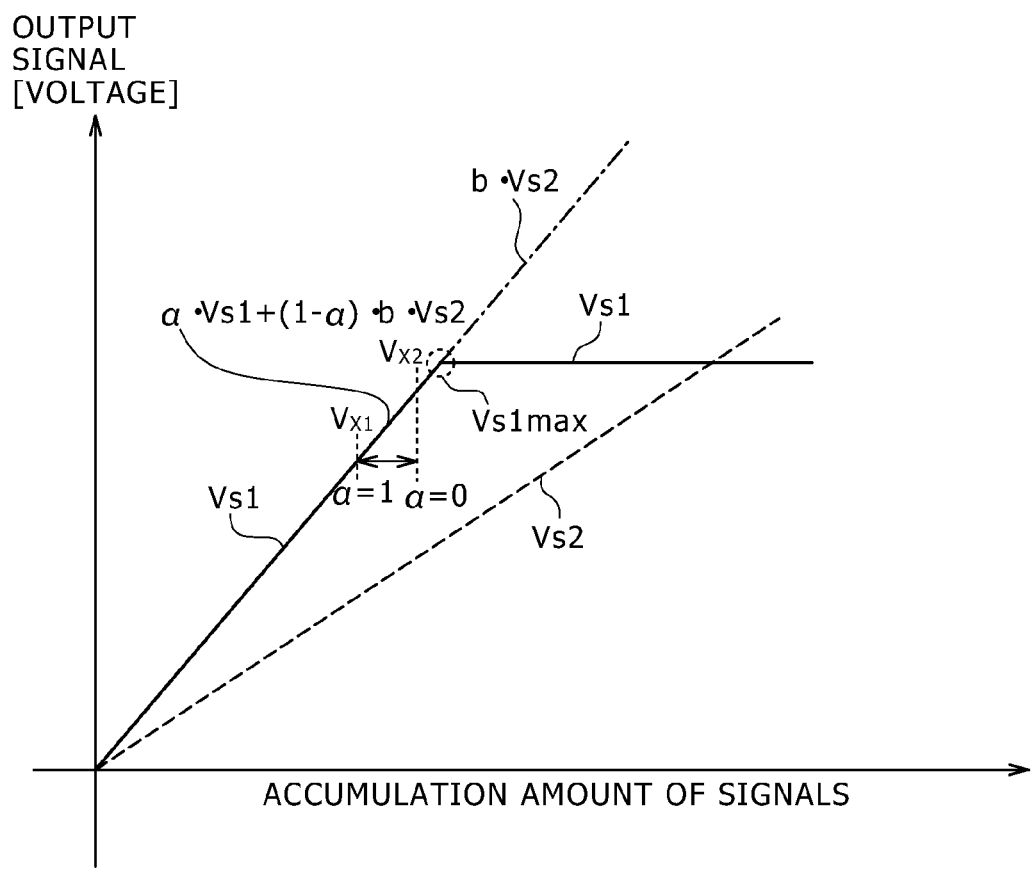
FIG. 12 is a graphical representation showing a relationship between an accumulation amount of signals, and output signals of a low illuminance signal and a high illuminance signal which are processed in the arithmetic operation processing portion according to the modification example.

In the arithmetic operation processing portion 65 in the modification example of the first embodiment, a coefficient $\alpha$ used to relax the switching time point between the low illuminance signal Vs1 and the high illuminance signal Vs2 with respect to the accumulation amount of signals is determined in the selecting unit 64. Then, a value ($=\alpha \cdot Vs1$) obtained by multiplying the low illuminance signal Vs1 by the coefficient $\alpha$ ($0 \leq \alpha \leq 1$), and a value ($=(1-\alpha) \cdot b \cdot Vs2$) obtained by multiplying a value, obtained by multiplying the high illuminance signal Vs2 by the addition coefficient b, by ($1-\alpha$) are added to each other. FIG. 12 shows a relationship between the accumulation amount of signals, and the output signals when such a coefficient $\alpha$ is determined. As shown in FIG. 12, the arithmetic operation in the arithmetic operation processing portion 65 is applied in a stage before the low illuminance signal Vs1 is saturated, that is, in a stage of the accumulation amount of signals before a switching time point Vs1max at which the low illuminance signal Vs1 and the high illuminance signal (b·Vs2) are switched over to each other.

It is to be noted that when the coefficient $\alpha=0$, the high illuminance signal (b·Vs2) is selected, and when the coefficient $\alpha=1$, the low illuminance signal Vs1 is selected.

As described above, when the accumulation amount of signals is smaller than the switching time point Vs1max, the signal ratio between the low illuminance signal Vs1 and the high illuminance signal (b·Vs2) is gradually changed, whereby the noise due to the switching can be made inconspicuous as compared with the case where all of the signals are switched from the low illuminance signals over to the high illuminance signals at a certain signal level.

It is to be noted that the coefficient $\alpha$ is suitably set within a region range in which both of the low illuminance signal Vs1 and the high illuminance signal (b·Vs2) can be sufficiently, linearly acquired when being composed as an image.

2. Second Embodiment

Method of Driving Solid-State Imaging Device

Next, a method of driving a solid-state imaging device according to a second embodiment of the present disclosure will be described. Since the entire configuration of the solid-state imaging device, and the configuration of the unit pixel in the second embodiment are the same as those in the first embodiment shown in FIGS. 1 to 6, a repeated description is omitted here. The solid-state imaging device in the second embodiment corresponds to a case where the column signal processing block 5 includes a correlated double sampling circuit (not shown) configured to remove any of the fixed pattern noise, and the driving method is different from that for the solid-state imaging device according to the first embodiment of the present disclosure.

Figure 13:
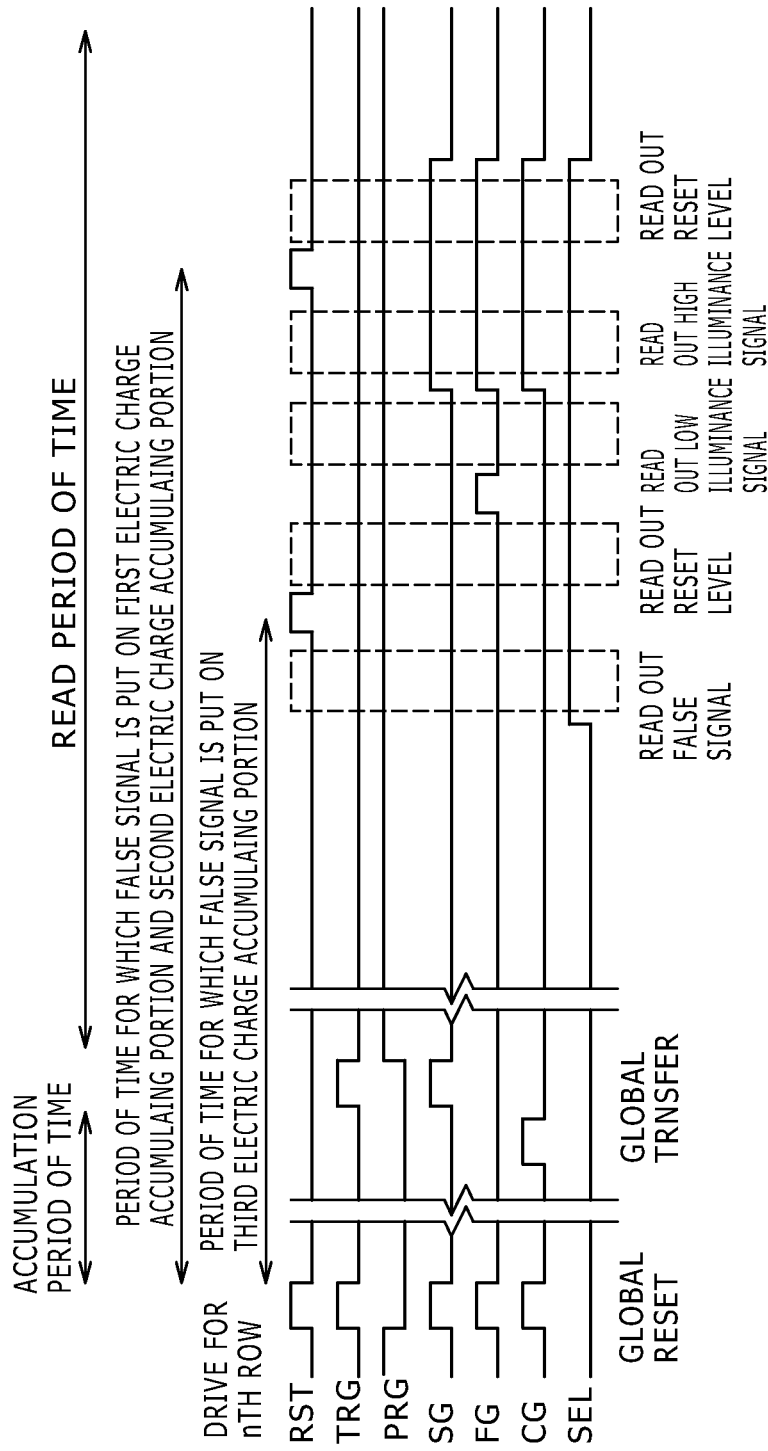
FIG. 13 is a timing chart explaining a method of driving a solid-state imaging device according to a second embodiment of the present disclosure.

FIG. 13 is a timing chart explaining the method of driving the solid-state imaging device according to the second embodiment of the present disclosure. Since the driving method from the start of global exposure to the end of global transfer is the same as that shown in FIG. 7, a repeated description is omitted here. In addition, in the driving method of the second embodiment, a description of the same portions as those in the first embodiment is omitted here.

In the second embodiment, for a reading-out period of time for the nth row, after the false signal Vn generated in the third electric charge accumulating portion 18 has been read out to set the second reset pulse RST to ON, the electric potential of the third electric charge accumulating portion 18 is read out again, thereby obtaining the rest level signal V_rst1. After that, the low illuminance signal Vs1 is obtained. As previously stated in the first embodiment, the low illuminance signal Vs1 is outputted in a state in which the false signal (V_1 false signal) and the reset level signal V_rst1 as the fixed pattern noise are both contained in the low illuminance signal Vs1. In the second embodiment, the reset level signal V_rst1 is read out before the low illuminance signal Vs1 is read out, and the reset level signal V_rst1 is subtracted from the low illuminance signal Vs1. As a result, it is possible to obtain a low illuminance signal Vs1' (=V_1 accumulated signal+V_1 false signal) obtained by removing away the reset level signal V_rst1.

Figure 14:
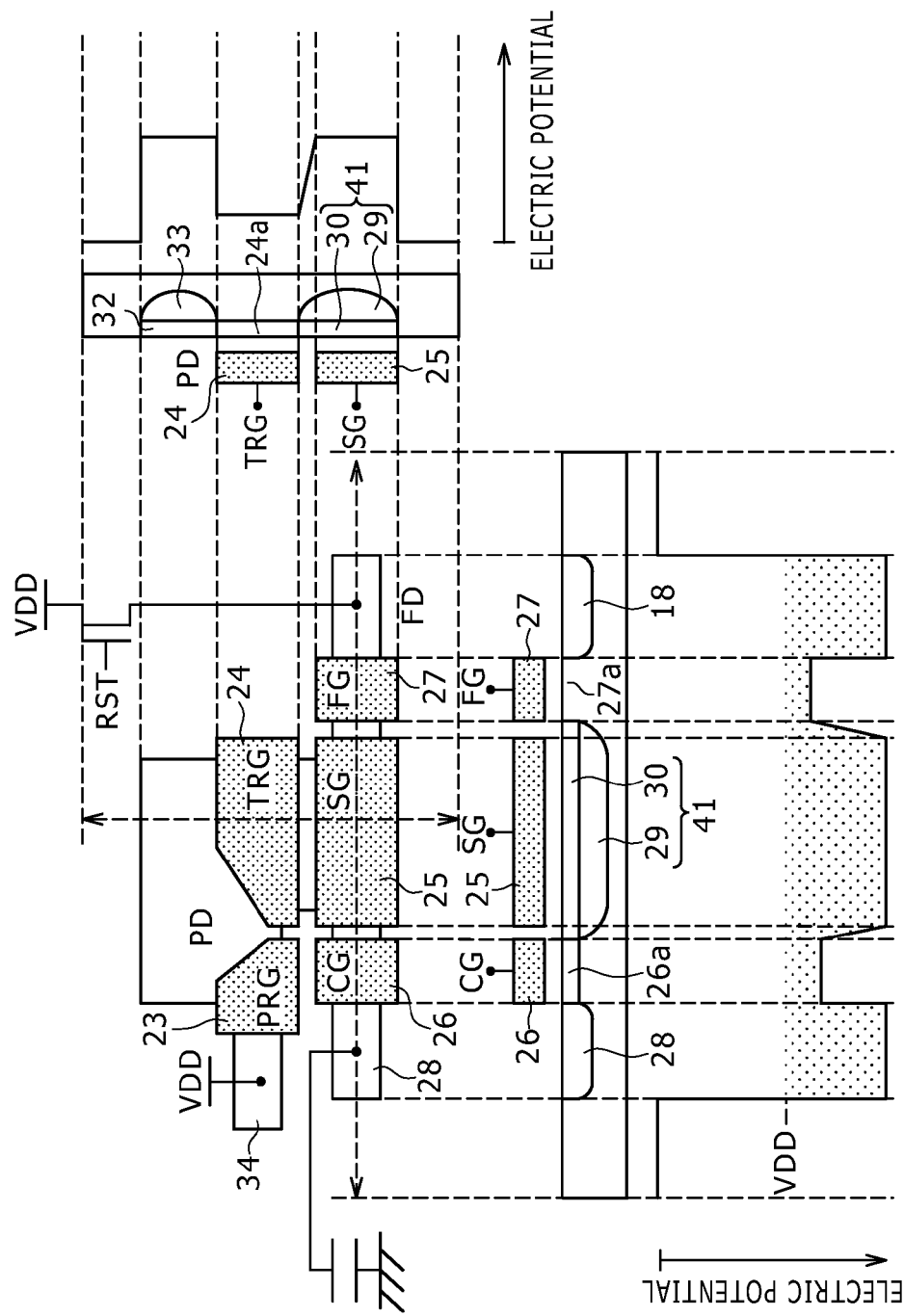
FIG. 14 is a cross sectional potential diagram explaining a movement of electrons, and transition of an electric potential in a phase of reading-out, and corresponding to the timing chart shown in FIG. 13.

Next, in the pixels belonging to the nth row, after the electric potential change pulse SG, the third transfer pulse FG, and the second transfer pulse CG have been all set to ON, and the high illuminance signals Vs2 accumulated in the first electric charge accumulating portion 41 and the second electric charge accumulating portion 28 have been read out, the second reset pulse RST is set to ON. FIG. 14 is a potential diagram at this time. As shown in FIG. 14, the second reset pulse RST is set to ON in a state in which the electric potential change pulse SG, the third transfer pulse FG, and the second transfer pulse CG are all set to ON, thereby obtaining the reset level signal V_rst2.

The high illuminance signal Vs2 read out in the preceding stage is outputted in a state in which the false signal (V_(1+2) false signal) and the reset level signal V_rst2 as the fixed pattern noise are both contained in the high illuminance signal Vs2. In the second embodiment, the reset level signal V_rst2 is read out after the high illuminance signal Vs2 has been read out, and the reset level signal V_rst2 is then subtracted from the high illuminance signal Vs2. As a result, it is possible to obtain a high illuminance signal Vs2' (=(V_(1+2) accumulated signal+(V_(1+2) false signal) obtained by removing away the reset level signal V_rst2.

In the second embodiment, as described above, the normal correlated double sampling is carried out by reading out the reset level signal. Also, in the second embodiment as well, the selecting unit 54 selects a value to be used as the pixel signal between the low illuminance signal Vs1' and the high illuminance signal Vs2'. Also, the desired pixel signal is obtained by subtracting the false signal (a·Vn) from the value selected in the selecting unit 54. In the second embodiment, the reset level signals V_rst1 and V_rst2 are outputted, thereby making it possible to obtain the desired accumulated signal obtained by removing any of the fixed pattern noise. As a result, the precision of the image quality is more enhanced in the driving method of the second embodiment than in the driving method of the first embodiment. In addition, the reset noise can also be removed away from the low illuminance signal Vs1.

In such a way, according to the method of driving the solid-state imaging device of the second embodiment, in the solid-state imaging device with the global shutter function in which the dynamic range is enlarged, it is possible to remove any of the false signal, the fixed pattern noise, and the like which are generated until the phase of the reading-out operation. Thus, the excellent image is obtained in which the deterioration of the image quality is improved.

3. Third Embodiment

Method of Driving Solid-State Imaging Device

Next, a method of driving a solid-state imaging device according to a third embodiment of the present disclosure will be described. The entire configuration of the solid-state imaging device in the third embodiment is the same as that in the first embodiment, but the method of driving the solid-state imaging device of the third embodiment corresponds to a case where the driving method is different from that for the solid-state imaging device 1 of the first embodiment. Therefore, in the third embodiment, a description of the planar structure and the circuit configuration is omitted here.

Figure 15:
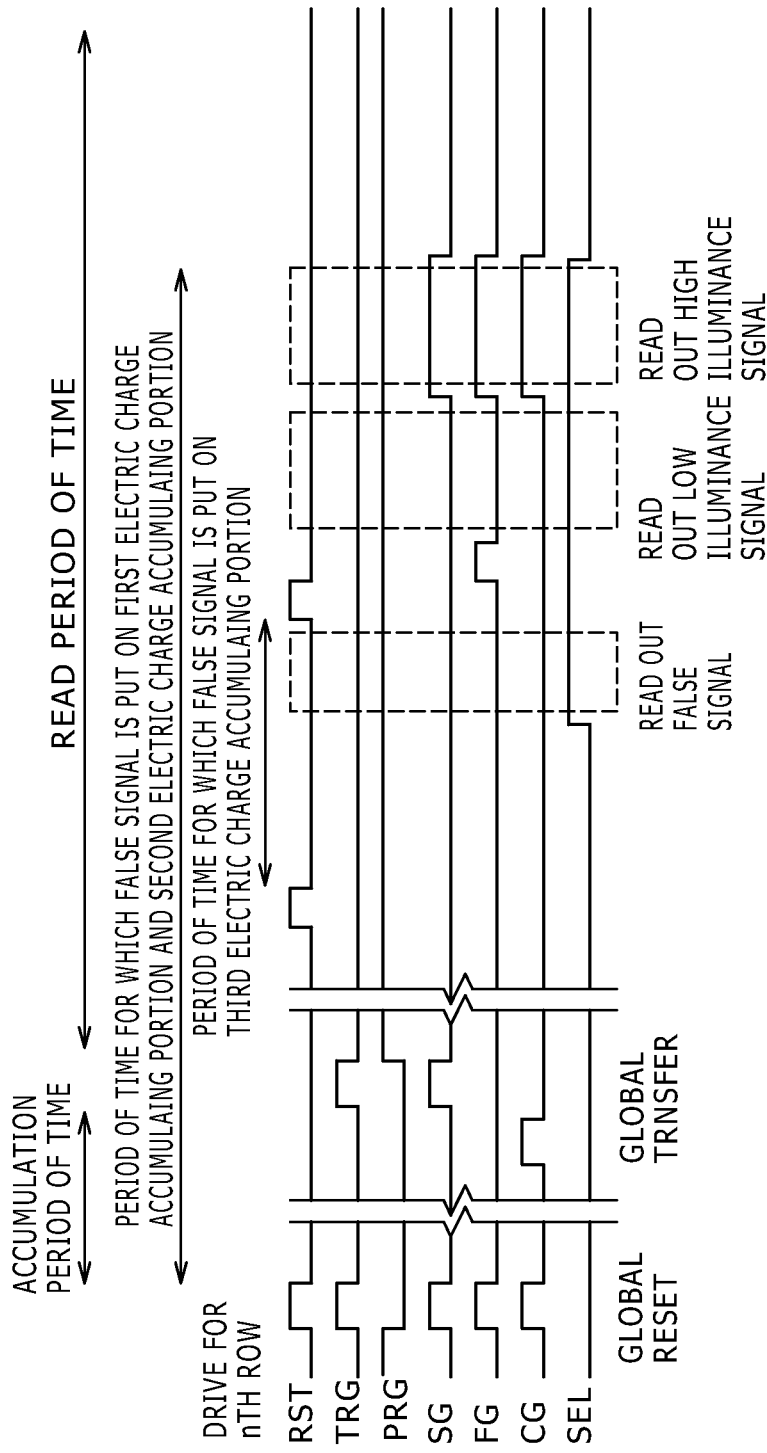
FIG. 15 is a timing chart explaining a method of driving a solid-state imaging device according to a third embodiment of the present disclosure.

FIG. 15 is a timing chart explaining the method of driving the solid-state imaging device according to the third embodiment of the present disclosure. Since the driving method from the start of global exposure to the end of global transfer is the same as that shown in FIG. 7, a repeated description is omitted here. In addition, in the driving method of the third embodiment, a description of the same portions as those in the first embodiment is omitted here.

In the third embodiment, for a reading-out period of time for the nth row, the second reset pulse RST is set to ON before the selection pulse SEL is set to ON, thereby discharging the false signal accumulated in the third electric charge accumulating portion 18. As a result, the false signal accumulated in the third electric charge accumulating portion 18 is reset by the time of the start of reading-out operation for the pixels belonging to the nth row from the accumulation period of time.

After the third electric charge accumulating portion 18 has been reset, the false signal Vn, the low illuminance signal Vs1, and the high illuminance signal Vs2 for the pixels belonging to the nth row are acquired similarly to the case of the first embodiment. Also, the same processing as that in the first embodiment is executed in the arithmetic operation processing portion 50, thereby making it possible to obtain the desired accumulated signal obtained by removing away the false signal Vn.

In the third embodiment, for the reading-out period of time, the third electric charge accumulating portion 18 is reset once before the selection pulse SEL is set to ON. As a result, a period of time for which the false signal is put on the third electric charge accumulating portion 18 becomes shorter in the third embodiment than in each of the first and second embodiments. For this reason, although the precision for the correction is slightly reduced, it is possible to prevent the third electric charge accumulating portion 18 from being saturated due to the false signals.

In addition thereto, it is possible to obtain the same effects as those in the first embodiment.

4. Fourth Embodiment

Solid-State Imaging Device

Next, a solid-state imaging device according to a fourth embodiment of the present disclosure will be described. Since an entire configuration of the solid-state imaging device of the fourth embodiment is the same as that of the solid-state imaging device of the first embodiment shown in FIG. 1, a repeated description is omitted here. The solid-state imaging device corresponds to a case where the fourth embodiment is different in pixel configuration from the first embodiment, and two adjacent pixels hold the third electric charge accumulating portion 18 in common.

Figure 16:
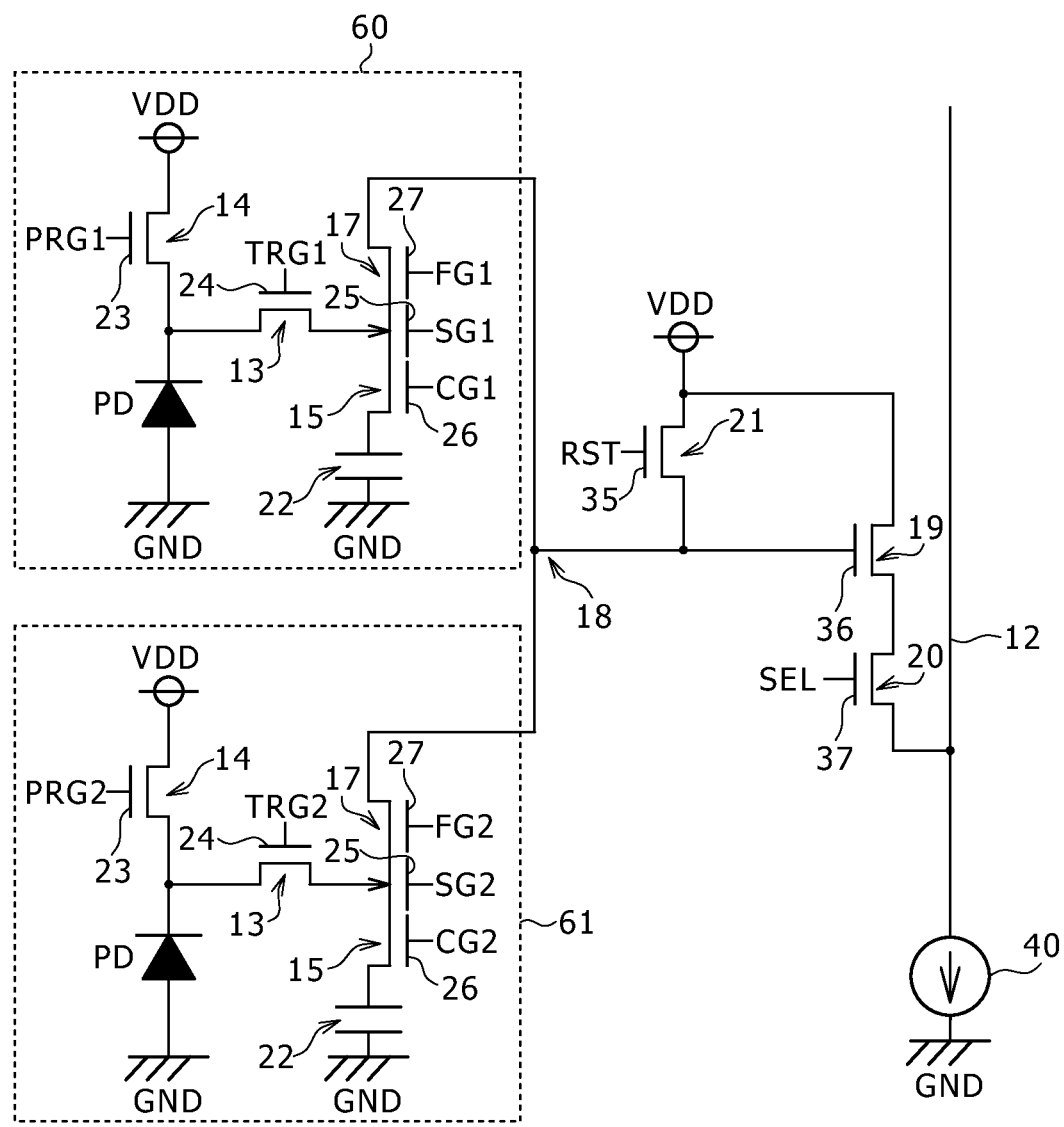
FIG. 16 is a diagram showing a pixel configuration of a solid-state imaging device according to a fourth embodiment of the present disclosure.

FIG. 16 is a diagram showing a pixel configuration in the solid-state imaging device according to the fourth embodiment of the present disclosure. In FIG. 16, two pixels adjacent to each other in the column direction (hereinafter referred to as "a first pixel 60" and "a second pixel 61," respectively) are shown as an example. In FIG. 16, constituent elements corresponding to those shown in FIG. 4 are designated by the same reference symbols, and a repeated description is omitted here.

As shown in FIG. 16, in each of the first pixel 60 and the second pixel 61, the photodiode PD, the first electric charge accumulating portion 41, the second electric charge accumulating portion 28, and the pixel transistors for driving the photodiode PD, the first electric charge accumulating portion 41, and the second electric charge accumulating portion 28 are formed every pixel. Also, the first pixel 60 and the second pixel 61 hold the third electric charge accumulating portion 18 in common. Therefore, the first pixel 60 and the second pixel 61 hold the second resetting transistor 21 configured to reset the third electric charge accumulating portion 18, the amplifier transistor 19, and the selecting transistor 20 as well in common.

In the first pixel 60, a first transfer pulse TRG1 is inputted to the first transferring transistor 13, a second transfer pulse CG1 is inputted to the second transferring transistor 15, and a third transfer pulse FG1 is inputted to the third transferring transistor 17. In addition, a first reset pulse PRG1 is inputted to the first resetting transistor 14, and an electric potential change pulse SG1 is inputted to the electric potential change electrode 25.

In the second pixel 61, a first transfer pulse TRG2 is inputted to the first transferring transistor 13, a second transfer pulse CG2 is inputted to the second transferring transistor 15, and a third transfer pulse FG2 is inputted to the third transferring transistor 17. In addition, a first reset pulse PRG2 is inputted to the first resetting transistor 14, and an electric potential change pulse SG2 is inputted to the electric potential change electrode 25.

Also, in the first pixel 60 and the second pixel 61 holding plural pixel transistors including the third electric charge accumulating portion 18 in common, the signal electric charges accumulated therein are read out at different timings. For example, in the phase of the scanning for the reading-out operation for the nth row, the signal electric charges are read out from the first pixel 60, and in the phase of the scanning for the reading-out operation for the (n+1)th row, the signal electric charges are read out from the second pixel 61. Any of the first to third embodiments can be applied to the timings for the pulses for these reading-out operations. In addition, the false signals accumulated in the third electric charge accumulating portion 18 are applied as a false signal for the first pixel 60, and a false signal for the second pixel 61.

According to the fourth embodiment of the present disclosure, since two pixels can hold the third electric charge accumulating portion 18 and the plural pixel transistors in common, the pixel area can be shrunk and the miniaturization becomes possible. In addition, even in the solid-state imaging device of the fourth embodiment, as far as the driving method, it is possible to adopt the same constitution as that of any of the first to third embodiments. Therefore, in the solid-state imaging device having the global shutter function, the dynamic range can be enlarged and any of the false signals can be suppressed.

In addition thereto, it is possible to obtain the same effects as those of any of the first to third embodiments.

Although in the fourth embodiment, the configuration is adopted in which two adjacent pixels hold the third electric charge accumulating portion 18 and the plural pixel transistors in common, a configuration may also be adopted in which two or more pixels hold the third electric charge accumulating portion 18 and the plural pixel transistors in common. In this case as well, the configuration is adopted in which the pixels adjacent to one another in the column direction hold the third electric charge accumulating portion 18 and the plural pixel transistors in common.

In such a way, when the two or more pixels hold the third electric charge accumulating portion 18 and the plural pixel transistors in common, the false signals generated in the third electric charge accumulating portion 18 which the plural pixels hold in common can be applied as the false signals for the two or more pixels.

The present disclosure can be applied not only to a solid-state imaging device configured to detect a distribution of quantities of incident visible light and capture the distribution thus detected in the form of an image, but also to a solid-state imaging device configured to capture a distribution of quantities of incidence of an infrared ray, an X-ray, particles or the like in the form of an image. In addition, in the broad sense, the present disclosure can also be applied to general solid-state imaging devices (physical amount distribution detectors) such as a fingerprint detecting sensor configured to detect a distribution of other physical amounts such as a pressure and a capacitance and capture the distribution thus detected in the form of an image.

In addition, the present disclosure is not limited to the solid-state imaging device configured to sequentially scan the unit pixels in the pixel area in respective rows and read out the pixel signals from the unit pixels. That is to say, the present disclosure can also be applied to an X-Y address type solid-state imaging device configured to select arbitrary pixels from respective pixels and read out signals from each of the selected pixels.

It is to be noted that the solid-state imaging device either may have a form of being formed as one chip, or may have a module-like form, having an imaging function, in which a pixel area and a signal processing block or an optical system are collectively packaged.

In addition, the present disclosure is not limited to the application to a solid-state imaging device, and can also be applied to an imaging device. Here, the imaging device means an electronic apparatus, having an imaging function, such as a camera system including a digital still camera or a video camera, or a mobile phone. It is to be noted that the above module-like form installed in an electronic apparatus, that is, a camera module may be meant as the imaging device in some cases.

5. Fifth Embodiment

Electronic Apparatus

Figure 17:
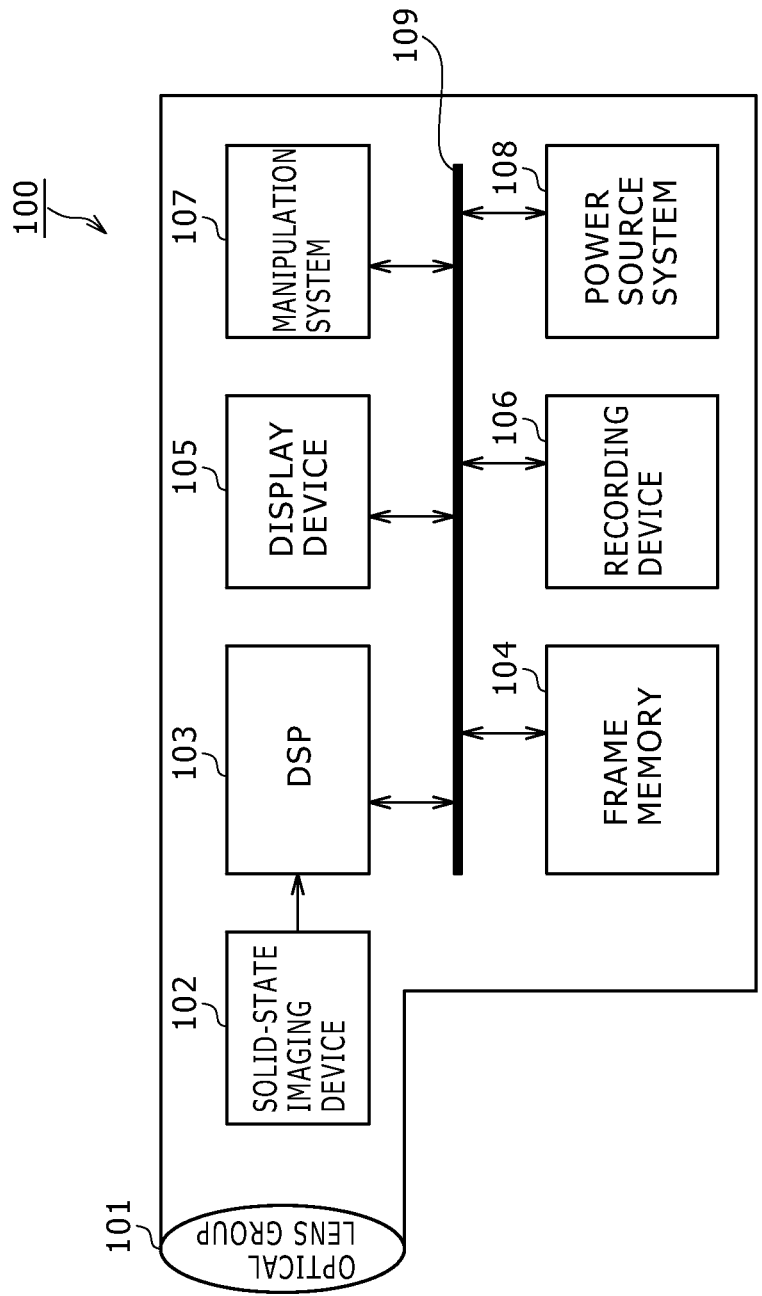
FIG. 17 is a block diagram showing a schematic configuration of a camera according to a fifth embodiment of the present disclosure.

Next, an electronic apparatus according to a fifth embodiment of the present disclosure will be described. In the fifth embodiment, the electronic apparatus is described by exemplifying a camera. FIG. 17 is a block diagram showing a schematic configuration of a camera 100 according to the fifth embodiment of the present disclosure.

The camera 100 of the fifth embodiment includes an optical lens group (optical system) 101, a solid-state imaging device 102, a DSP (digital signal processor) 103, a frame memory 104, a display device 105, a recording device 106, a manipulation system 107, a power source system 108, and the like. Of these constituent elements 101 to 108, the DSP 103, the frame memory 104, the display device 105, the recording device 106, the manipulation system 107, and the power source system 108 are connected to a common bus line 109.

The optical lens group 101 guides an image light (incident light) from a subject to an imaging area (a pixel array block: a pixel block) of the solid-state imaging device 102. In this case, the above solid-state imaging device 1 according to the first embodiment of the present disclosure is applied as the solid-state imaging device 102. The solid-state imaging device 102 converts the image light imaged on the imaging area by the optical lens group 101 into an electric signal in increments of pixels. The DSP 103 controls the solid-state imaging device 102, and receives the signal supplied from the solid-state imaging device 102, thereby generating an image signal. The frame memory 104 is a memory which is used to temporarily store therein the image signal processed in the DSP 103.

The display device 105 displays thereon an image based on the image signal outputted as a result of processing in the DSP 103. The recording device 106 records the image signal, for example, in a magnetic tape, a magnetic disc, an optical disc or the like. The manipulation system 107 is a system for manipulation of the camera. The power source system 108 supplies an electric power used to drive the solid-state imaging device 102.

The camera 100 of the fifth embodiment of the present disclosure can adopt a form of a camera module into which the optical lens group 101, the solid-state imaging device 102, the DSP 103, the frame memory 104, the power source system 108, and the like are modularized.

The present disclosure can constitute a portable apparatus with a camera, for example, typified by a mobile phone including such a camera module.

In addition, the camera 100 can be configured in the form of a module having an imaging function obtained through the modularization described above, that is, a so-called imaging function module.

In the camera 100 of the fifth embodiment, since in the solid-state imaging device 102, the dynamic range is enlarged and any of the false signals is removed away, the image quality is enhanced. In addition, since the camera 100 of the fifth embodiment has the global shutter function, in the phase of capturing an image of a moving subject, the focal plane deformation is dissolved.

The fifth embodiment adopts the configuration in which the solid-state imaging device 1 of the first embodiment is used as the solid-state imaging device 102 in the camera 100. However, alternatively, any one of the solid-state imaging devices manufactured as described in the second to fourth embodiments can also be used as the solid-state imaging device 102 in the camera 100.

It should be noted that the present disclosure can adopt the following constitutions.

(1) A solid-state imaging device including:
  a photoelectric conversion portion generating signal electric charges corresponding to a quantity of light;
  a pixel array block having pixels two-dimensionally arranged in a matrix, each of the pixels having
    three or more electric charge accumulating portions including
      a first electric charge accumulating portion to which the signal electric charges generated in the photoelectric conversion portion are transferred,
      a second electric charge accumulating portion to which the signal electric charges, whose amount exceeds a saturated amount of electric charges in the photoelectric conversion portion, of the signal electric charges generated in the photoelectric conversion portion are transferred, and
      a third electric charge accumulating portion reading out the signal electric charges accumulated in the first electric charge accumulating portion as a low illuminance signal and then reading out the signal electric charges accumulated in the second electric charge accumulating portion together with the signal electric charges accumulated in the first electric charge accumulating portion as a high illuminance signal, and
    plural pixel transistors transferring and reading out the signal electric charges;
  a scanning block carrying out scanning in such a way that accumulation periods of time for the signal electric charges become simultaneous for all of the pixels, and scanning reading-out of the low illuminance signal and the high illuminance signal to the third electric charge accumulating portion in a reading-out periods of time every row; and
  an arithmetic operation processing portion acquiring a false signal accumulated in the third electric charge accumulating portion before the reading-out of the low illuminance signal in a phase of reading out for each row in the reading-out period of time, and correcting both of the low illuminance signal and the high illuminance signal by using the false signal.

(2) The solid-state imaging device described in the paragraph (1),
  in which an electric potential adjusting electrode is formed on an upper portion of the first electric charge accumulating portion through an insulating film, and
  the first electric charge accumulating portion has a charge coupled device structure.

(3) The solid-state imaging device described in the paragraph (1) or (2), further including:
  a first transferring transistor transferring the signal electric charges accumulated in the photoelectric conversion portion;
  a second transferring transistor transferring the signal electric charges accumulated in the first electric charge accumulating portion to the second electric charge accumulating portion; and
  a third transferring transistor transferring the signal electric charges accumulated in the first electric charge accumulating portion to the third electric charge accumulating portion,
  in which an electric potential of a second transfer gate portion of the second transferring transistor is formed so as to be deeper than that of a third transfer gate portion of the third transferring transistor.

(4) The solid-state imaging device described in any one of the paragraphs (1) to (3), in which plural pixels hold part of the plural pixel transistors in common.

(5) The solid-state imaging device described in any one of the paragraphs (1) to (4), further including:
  a correlated double sampling circuit,
  in which the correlated double sampling circuit reads out a reset electric potential of the third electric charge accumulating portion before the low illuminance signal is read out, and subtracts the reset electric potential concerned from the low illuminhance signal, thereby removing away a fixed pattern noise and a reset noise from the low illuminance signal, and
  the correlated double sampling circuit further reads out reset electric potentials of the first to third electric charge accumulating portions after the high illuminance signal is read out, and subtracts the reset electric potentials concerned from the high illuminannce signal, thereby removing away a fixed pattern noise from the high illuminance signal.

(6) The solid-state imaging device described in any one of the paragraphs (1) to (5),
  in which the arithmetic operation processing portion includes a selecting unit selecting the low illuminance signal when the low illuminance signal is not saturated, and selecting the high illuminance signal when the low illuminance signal is saturated, and
  the arithmetic operation processing portion subtracts the false signal from selected one of the low illuminance signal or the high illuminance signal.

(7) The solid-state imaging device described in the paragraph (6), in which the selecting unit selects a value obtained by adding the low illuminance signal and the high illuminance signal to each other at a predetermined ratio at a time point before the low illuminance signal is switched over to the high illuminance signal in accordance with an accumulation amount of signals, and the false signal is subtracted from the value thus selected.

(8) A method of driving a solid-state imaging device, the solid-state imaging device including:
  a photoelectric conversion portion generating signal electric charges corresponding to a quantity of light; and a pixel array block having pixels two-dimensionally arranged in a matrix, each of the pixels including
three or more electric charge accumulating portions including
a first electric charge accumulating portion to which the signal electric charges generated in the photoelectric conversion portion are transferred,
a second electric charge accumulating portion to which the signal electric charges, whose amount exceeds a saturated amount of electric charges in the photoelectric conversion portion, of the signal electric charges generated in the photoelectric conversion portion are transferred, and
a third electric charge accumulating portion reading out the signal electric charges accumulated in the first electric charge accumulating portion as a low illuminance signal and then reading out the signal electric charges accumulated in the second electric charge accumulating portion together with the signal electric charges accumulated in the first electric charge accumulating portion as a high illuminance signal, and
plural pixel transistors transferring and reading out the signal electric charges,
the driving method including:
starting exposure simultaneously for all of the pixels, transferring the signal electric charges overflowing from the photoelectric conversion portion to the first electric charge accumulating portion during an exposure period of time to the second electric charge accumulating portion simultaneously for all of the pixels after end of the exposure, and then transferring the signal electric charges accumulated in the photoelectric conversion portion to the second electric charge accumulating portion;
acquiring a false signal accumulated in the third electric charge accumulating portion for a reading-out period of time;
acquiring the signal electric charges accumulated in the first electric charge accumulating portion as the low illuminance signal;
acquiring the signal electric charges accumulated in the second electric charge accumulating portion together with the signal electric charges accumulated in the first electric charge accumulating portion as the high illuminance signal; and
subtracting the false signal from both of the low illuminance signal and the high illuminance signal to calculate an amount of signal obtained through the photoelectric conversion in the photoelectric conversion portion during the exposure period of time.

(9) The method of driving the solid-state imaging device described in the paragraph (8), in which the amount of signal generated through the photoelectric conversion in the photoelectric conversion portion during the exposure period of time is obtained by subtracting a value obtained by multiplying the false signal by a correction coefficient from a value obtained by multiplying either the low illuminance signal or the high illuminance signal by a coefficient.

(10) The method of driving the solid-state imaging device described in the paragraph (8) or (9),
in which before the low illuminance signal is read out, a reset electric potential of the third electric charge accumulating portion is read out, and is subtracted from the low illuminance signal, thereby removing away a fixed pattern noise and a reset noise from the low illuminance signal, and
after the high illuminance signal is read out, reset electric potentials of the first to third electric charge accumulating portions are read out, and are subtracted from the high illuminance signal, thereby removing away a fixed pattern noise from the high illuminance signal.

(11) The method of driving the solid-state imaging device described in any one of the paragraphs (8) to (10), in which in calculating the amount of signal generated through the photoelectric conversion in the photoelectric conversion portion during the exposure period of time, the low illuminance signal is selected when the low illuminance signal is not saturated, the high illuminance signal is selected when the low illuminance signal is saturated, and the false signal is subtracted from selected one of the low illuminance signal or the high illuminance signal.

(12) The method of driving the solid-state imaging device described in the paragraph (11), in which at a time point before the low illuminance signal is switched over to the high illuminance signal in accordance with an accumulation amount of signal, a value obtained by adding the low illuminance signal and the high illuminance signal to each other at a predetermined ratio is selected, and the false signal is subtracted from the value thus selected.

(13) An electronic apparatus, having a solid-state imaging device including:
a photoelectric conversion portion generating signal electric charges corresponding to a quantity of light;
a pixel array block having pixels two-dimensionally arranged in a matrix, each of the pixels including
three or more electric charge accumulating portions including
a first electric charge accumulating portion to which the signal electric charges generated in the photoelectric conversion portion are transferred,
a second electric charge accumulating portion to which the signal electric charges, whose amount exceeds a saturated amount of electric charges in the photoelectric conversion portion, of the signal electric charges generated in the photoelectric conversion portion are transferred, and
a third electric charge accumulating portion reading out the signal electric charges accumulated in the first electric charge accumulating portion as a low illuminance signal and then reading out the signal electric charges accumulated in the second electric charge accumulating portion together with the signal electric charges accumulated in the first electric charge accumulating portion as a high illuminance signal, and
plural pixel transistors transferring and reading out the signal electric charges;
a scanning block carrying out scanning in such a way that accumulation periods of time for the signal electric charges become simultaneous for all of the pixels, and scanning reading-out of the low illuminance signal and the high illuminance signal to the third electric charge accumulating portion in a reading-out periods of time every row; and
an arithmetic operation processing portion acquiring a false signal accumulated in the third electric charge accumulating portion before the reading-out of the low illuminance signal in a phase of reading out for each row in the reading-out period of time, and correcting both of the low illuminance signal and the high illuminance signal by using the false signal.

The present disclosure contains subject matter related to that disclosed in Japanese Priority Patent Application JP 2011-152628 filed in the Japan Patent Office on Jul. 11, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a photoelectric conversion portion generating signal electric charges corresponding to a quantity of light;
   a pixel array block having pixels two-dimensionally arranged in a matrix, each of the pixels including
      three or more electric charge accumulating portions including
         a first electric charge accumulating portion to which the signal electric charges generated in the photoelectric conversion portion are transferred,
         a second electric charge accumulating portion to which the signal electric charges, whose amount exceeds a saturated amount of electric charges in the photoelectric conversion portion, of the signal electric charges generated in the photoelectric conversion portion are transferred, and
         a third electric charge accumulating portion reading out the signal electric charges accumulated in the first electric charge accumulating portion as a low illuminance signal and then reading out the signal electric charges accumulated in the second electric charge accumulating portion together with the signal electric charges accumulated in the first electric charge accumulating portion as a high illuminance signal, and
      plural pixel transistors transferring and reading out the signal electric charges;
   a scanning block carrying out scanning in such a way that accumulation periods of time for the signal electric charges become simultaneous for all of the pixels, and scanning reading-out of the low illuminance signal and the high illuminance signal to the third electric charge accumulating portion in a reading-out periods of time every row; and
   an arithmetic operation processing portion acquiring a false signal accumulated in the third electric charge accumulating portion before the reading-out of the low illuminance signal in a phase of reading out for each row in the reading-out period of time, and correcting both of the low illuminance signal and the high illuminance signal by using the false signal.

2. The solid-state imaging device according to claim 1, wherein an electric potential adjusting electrode is formed on an upper portion of the first electric charge accumulating portion through an insulating film, and
   the first electric charge accumulating portion has a charge coupled device structure.

3. The solid-state imaging device according to claim 2, further comprising:
   a first transferring transistor transferring the signal electric charges accumulated in the photoelectric conversion portion;
   a second transferring transistor transferring the signal electric charges accumulated in the first electric charge accumulating portion to the second electric charge accumulating portion; and
   a third transferring transistor transferring the signal electric charges accumulated in the first electric charge accumulating portion to the third electric charge accumulating portion,
   wherein an electric potential of a second transfer gate portion of the second transferring transistor is formed so as to be deeper than that of a third transfer gate portion of the third transferring transistor.

4. The solid-state imaging device according to claim 3, wherein plural pixels hold part of the plural pixel transistors in common.

5. The solid-state imaging device according to claim 4, further comprising:
   a correlated double sampling circuit,
   wherein the correlated double sampling circuit reads out a reset electric potential of the third electric charge accumulating portion before the low illuminance signal is read out, and subtracts the reset electric potential concerned from the low illuminhance signal, thereby removing away a fixed pattern noise and a reset noise from the low illuminance signal, and
   the correlated double sampling circuit further reads out reset electric potentials of the first to third electric charge accumulating portions after the high illuminance signal is read out, and subtracts the reset electric potentials concerned from the high illuminannce signal, thereby removing away a fixed pattern noise from the high illuminance signal.

6. The solid-state imaging device according to claim 1,
   wherein the arithmetic operation processing portion includes a selecting unit selecting the low illuminance signal when the low illuminance signal is not saturated, and selecting the high illuminance signal when the low illuminance signal is saturated, and
   the arithmetic operation processing portion subtracts the false signal from selected one of the low illuminance signal or the high illuminance signal.

7. The solid-state imaging device according to claim 6, wherein the selecting unit selects a value obtained by adding the low illuminance signal and the high illuminance signal to each other at a predetermined ratio at a time point before the low illuminance signal is switched over to the high illuminance signal in accordance with an accumulation amount of signals, and the false signal is subtracted from the value thus selected.

8. A method of driving a solid-state imaging device, the solid-state imaging device including:
   a photoelectric conversion portion generating signal electric charges corresponding to a quantity of light; and
   a pixel array block having pixels two-dimensionally arranged in a matrix, each of the pixels including
      three or more electric charge accumulating portions including
         a first electric charge accumulating portion to which the signal electric charges generated in the photoelectric conversion portion are transferred,
         a second electric charge accumulating portion to which the signal electric charges, whose amount exceeds a saturated amount of electric charges in the photoelectric conversion portion, of the signal electric charges generated in the photoelectric conversion portion are transferred, and
         a third electric charge accumulating portion reading out the signal electric charges accumulated in the first electric charge accumulating portion as a low illuminance signal and then reading out the signal electric charges accumulated in the second electric charge accumulating portion together with the signal electric charges accumulated in the first electric charge accumulating portion as a high illuminance signal, and
      plural pixel transistors transferring and reading out the signal electric charges, the driving method comprising:
starting exposure simultaneously for all of the pixels, transferring the signal electric charges overflowing from the photoelectric conversion portion to the first electric charge accumulating portion during an exposure period of time to the second electric charge accumulating portion simultaneously for all of the pixels after end of the exposure, and then transferring the signal electric charges accumulated in the photoelectric conversion portion to the second electric charge accumulating portion;

acquiring a false signal accumulated in the third electric charge accumulating portion for a reading-out period of time;

acquiring the signal electric charges accumulated in the first electric charge accumulating portion as the low illuminance signal;

acquiring the signal electric charges accumulated in the second electric charge accumulating portion together with the signal electric charges accumulated in the first electric charge accumulating portion as the high illuminance signal; and subtracting the false signal from both of the low illuminance signal and the high illuminance signal to calculate an amount of signal obtained through the photoelectric conversion in the photoelectric conversion portion during the exposure period of time.

9. The method of driving the solid-state imaging device according to claim 8, wherein the amount of signal generated through the photoelectric conversion in the photoelectric conversion portion during the exposure period of time is obtained by subtracting a value obtained by multiplying the false signal by a correction coefficient from a value obtained by multiplying either the low illuminance signal or the high illuminance signal by a coefficient.

10. The method of driving the solid-state imaging device according to claim 8,
wherein before the low illuminance signal is read out, a reset electric potential of the third electric charge accumulating portion is read out, and is subtracted from the low illuminance signal, thereby removing away a fixed pattern noise and a reset noise from the low illuminance signal, and after the high illuminance signal is read out, reset electric potentials of the first to third electric charge accumulating portions are read out, and are subtracted from the high illuminance signal, thereby removing away a fixed pattern noise from the high illuminance signal.

11. The method of driving the solid-state imaging device according to claim 8, wherein in calculating the amount of signal generated through the photoelectric conversion in the photoelectric conversion portion during the exposure period of time, the low illuminance signal is selected when the low illuminance signal is not saturated, the high illuminance signal is selected when the low illuminance signal is saturated, and the false signal is subtracted from selected one of the low illuminance signal or the high illuminance signal.

12. The method of driving the solid-state imaging device according to claim 11, wherein at a time point before the low illuminance signal is switched over to the high illuminance signal in accordance with an accumulation amount of signal, a value obtained by adding the low illuminance signal and the high illuminance signal to each other at a predetermined ratio is selected, and the false signal is subtracted from the value thus selected.

13. An electronic apparatus, comprising a solid-state imaging device including:
a photoelectric conversion portion generating signal electric charges corresponding to a quantity of light;
a pixel array block having pixels two-dimensionally arranged in a matrix, each of the pixels including
three or more electric charge accumulating portions including
a first electric charge accumulating portion to which the signal electric charges generated in the photoelectric conversion portion are transferred,
a second electric charge accumulating portion to which the signal electric charges, whose amount exceeds a saturated amount of electric charges in the photoelectric conversion portion, of the signal electric charges generated in the photoelectric conversion portion are transferred, and
a third electric charge accumulating portion reading out the signal electric charges accumulated in the first electric charge accumulating portion as a low illuminance signal and then reading out the signal electric charges accumulated in the second electric charge accumulating portion together with the signal electric charges accumulated in the first electric charge accumulating portion as a high illuminance signal, and
plural pixel transistors transferring and reading out the signal electric charges;
a scanning block carrying out scanning in such a way that accumulation periods of time for the signal electric charges become simultaneous for all of the pixels, and scanning reading-out of the low illuminance signal and the high illuminance signal to the third electric charge accumulating portion in a reading-out periods of time every row; and
an arithmetic operation processing portion acquiring a false signal accumulated in the third electric charge accumulating portion before the reading-out of the low illuminance signal in a phase of reading out for each row in the reading-out period of time, and correcting both of the low illuminance signal and the high illuminance signal by using the false signal.

* * * * *